United States Patent
Pisek et al.

(10) Patent No.: US 6,658,440 B1
(45) Date of Patent: Dec. 2, 2003

(54) MULTI CHANNEL FILTERING DEVICE AND METHOD

(75) Inventors: Eran Pisek, Holon (IE); Moshe Tarrab, Holon (IE); David Moshe, Ta'anach (IE)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/512,559

(22) Filed: Feb. 24, 2000

(30) Foreign Application Priority Data

Mar. 20, 1999 (EP) .............................. 99105743

(51) Int. Cl.[7] .............................................. G06F 17/10
(52) U.S. Cl. ....................................... 708/300; 708/303
(58) Field of Search ................ 708/490, 523, 708/300, 303, 308, 313, 314, 319, 320, 316

(56) References Cited

U.S. PATENT DOCUMENTS

| 4,881,191 A | | 11/1989 | Morton | |
| 4,918,637 A | | 4/1990 | Morton | |
| 5,262,972 A | | 11/1993 | Holden et al. | |
| 5,319,584 A | * | 6/1994 | Ooyabu | 708/303 |
| 5,339,264 A | | 8/1994 | Said et al. | |
| 5,438,532 A | * | 8/1995 | Nagao et al. | 708/319 |
| 5,621,800 A | | 4/1997 | Weng et al. | |
| 5,652,903 A | | 7/1997 | Weng et al. | |
| 6,360,240 B1 | * | 3/2002 | Takano et al. | 708/319 |

FOREIGN PATENT DOCUMENTS

| EP | 0275136 | 7/1988 |
| WO | WO 97/50173 | 12/1997 |

* cited by examiner

Primary Examiner—Chuong Dinh Ngo

(57) ABSTRACT

A filter comprising of an internal memory for storing data and coefficients; an address generation unit, for generating memory addresses; a multiply and accumulate unit (i.e.—MAC unit), for performing multiply and accumulate functions. The filter can operate in a plurality of modes, such as multiple or single channel FIR filtering; multiple or single channel IIR filtering; multiple or single channel echo cancellation; multiple or single channel decimation and multiple or single channel extrapolation.

15 Claims, 17 Drawing Sheets

MULTI CHANNEL FILTERING DEVICE AND METHOD

FIELD OF THE INVENTION

The present invention relates generally to a method and device for filtering data associated with a plurality of communication channels, and more particularly to filtering data in various modes such as finite impulse response filtering mode, infinite impulse response filtering mode, extrapolation mode, decimation mode and echo cancellation mode.

BACKGROUND OF THE INVENTION

Wireless communication systems require extensive digital signal processing, whereas the digital signal can originate from multiple communication channels. Digital signal processing can involve Finite Impulse Response Filtering (i.e.—FIR filtering), Infinite Impulse Response Filtering (i.e.—IIR filtering), decimation and extrapolation. Both decimation and extrapolation involve FIR filtering.

Digital filtering response also assists to cancel echoes resulting from coupling far end users and close end users. Echo canceling also involves FIR filtering.

Prior art digital signal processors handled multi channel filtering in an inefficient manner, wherein the jumping from the process of a channel to another required to store relatively large amount of data status. Prior art digital processor needed to use at least two registers to store the status of each channel.

There is a need of an improved filter, for processing data from multiple channels.

BRIEF DESCRIPTION OF THE DRAWINGS

While the invention is pointed out with particularity in the appended claims, other features of the invention are disclosed by the following detailed description taken in conjunction with the accompanying drawings, in which:

DETAILED DESCRIPTION OF THE INVENTION

It should be noted that the particular terms and expressions employed and the particular structural and operational details disclosed in the detailed description and accompanying drawings are for illustrative purposes only and are not intended to in any way limit the scope of the invention as described in the appended claims.

Generally, an aspect of the invention is an improved filter and method, for processing data from multiple channels.

Another aspect of the invention relates to the ability to switch from one operation mode to another operation mode, whereas the switching requires to store just a negligible amount of status parameters.

Figure 1:
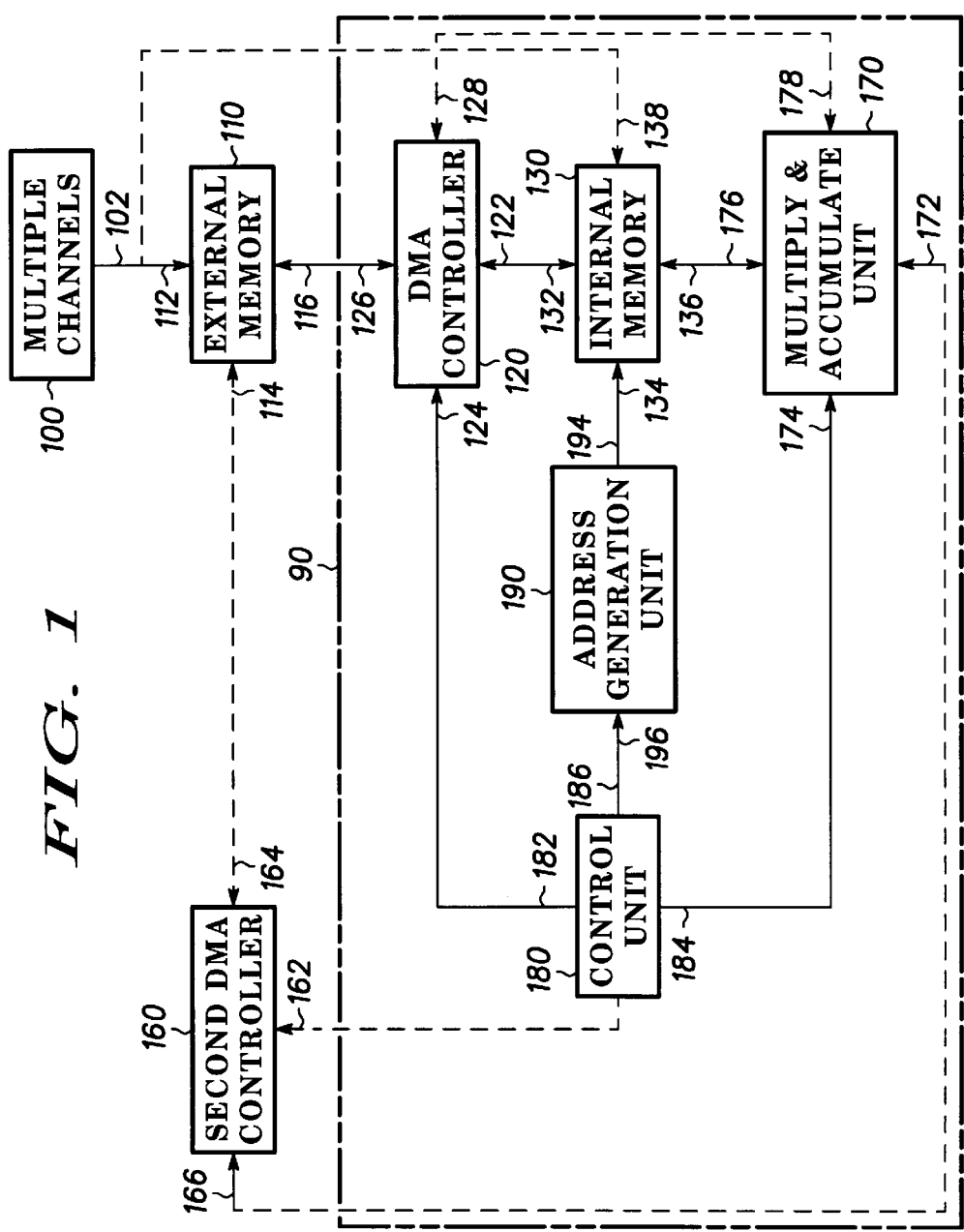
FIG. 1 is a schematic description of a filter, coupled to an external memory, to multiple communication channels and a second Direct Memory Access controller (i.e.—DMA controller), according to a preferred embodiment of the invention.

FIG. 1 is a schematic description of a filter 90, coupled to external memory 110, to multiple channels 100 and to second Direct Memory Access controller (i.e.—DMA controller) 160, according to a preferred embodiment of the invention.

Filter 90 is capable of supporting multiple modes. In the preferred embodiment, five modes of operation are supported:

Multiple or single channel FIR filtering.
Multiple or single channel IIR filtering.
Multiple or single channel echo cancellation.

Multiple or single channel decimation.

Multiple or single channel extrapolation.

Conveniently, a singe channel mode involves filtering data associated with a single channel. Filter 90 can finish filtering a channel in a single channel mode and start to filter or process another channel in a different single channel mode. Multiple channel mode involves processing or filtering data received from multiple channels, simultaneously.

Conveniently, when processing multiple channels, the filters associated with all W communication channels have the same length—the number of taps V. Else, filter 90 operates in a single channel mode.

Various communication channels (i.e.—channels) can be processed or filtered in different modes. For example, the K'th channel can be filtered by a FIR filter, while the (K+1)'th channel can be filtered by an IIR filter, K being an index having values of 1 to W. Conveniently, filter 90 operates in a multi channel mode when all W channels, are processed in the same manner (i.e.—FIR filtering, IIR filtering, extrapolation, decimation, echo cancellation).

Usually, when filter 90 is activated in a multi channel mode it processes the various channels in a fixed order. For example—filter 90 starts to process the first channel, then it starts to process the second channel ect., but this is not necessary, and filter 90 can be programmed to filter various channels in a varying order.

For convenience of explanation, is it assumed that when filter 90 works in a multi channel mode, the length of all W filters is equal, and that all W channels are filtered or processed in the same manner.

Filter 90 comprises of internal memory 130, address generation unit (i.e.—AGU) 190 and a Multiply and Accumulate unit (i.e.—MAC unit) 170. Filter 90 can also be comprised of control unit 180. Control unit 180 can also be implemented by an external processor (i.e.—processor) 1220 (shown in FIG. 17).

Multiple channels 100 provide multiple data samples, to be filtered by filter 90. Multiple channels 100 have multiple outputs, collectively denoted as 102.

External memory 110 has Inputs/Outputs (i.e. I/O's) 116 and 114 and input 112. DMA 120 has I/O's 126, 122 and 124 and can also have I/O 128. Internal memory 130 has I/O's 132, 136, input 134 and can also have I/O 138. MAC unit 170 has I/O 176 and input 174 and can also have I/O 172. Control unit 180 has outputs 182, 184 and 186 and can also have output 188. Second DMA 160 has I/O 166 and 164 and input 162.

Conveniently, filter 90 is coupled to DMA 120 and to external memory 110. As indicated by the dashed lines, control unit 180 and MAC unit 170 are coupled to second DMA 160, MAC 170 is coupled to DMA 120, and internal memory 130 is coupled to multiple channels, thus providing a more efficient transfer of data, coefficients and MAC operation results (collectively referred to as information) between MAC unit 170 and external memory 110, between MAC unit 170 and internal memory 130, and between multiple channels 100 and internal memory 130.

I/O 102 of multiple channels 100 is coupled to I/O 112 of external memory 110. I/O 126 of DMA 120 is coupled to I/O 116 of external memory 110. I/O 122 of DMA 120 is coupled to I/O 132 of internal memory 110. I/O 138 of external memory 130 is coupled to I/O 102 of multiple channels 100. I/O 176 of MAC unit 170 is coupled to I/O 136 of internal memory 110. I/O 178 of MAC unit 170 is coupled to I/O 128 of DMA 120. I/O 172 of MAC unit 170 is coupled to I/O 166 of second DMA 160. Outputs 182, 184, 186 and 188 of control unit 180 are coupled to inputs 124 of DMA 120, input 174 of Mac unit 170, input 196 of AGU 190, and input 162 of second DMA 160 accordingly.

External memory 110 can store data words, taps, and the results of the filtering process. When filter 90 operates in multiple channel FIR filtering, decimation and extrapolation modes, external memory stores W Y-element external data vectors. When filter 90 operates in multiple channel IIR filtering, external memory 110 stores W external data/result vectors. An external data/result vector initially comprises by data words, which are gradually replaced by the results of the IIR filtering. When filter 90 operates in a multiple channel echo canceling mode, external memory 110 stores W external data/sample vectors. An external data/sample vector initially comprises of data words, which are gradually replaced by samples from signals which pass through the W communication channels.

When filter 90 operates in multi channel FIR filtering, IIR filtering, decimation and echo canceling modes, external memory 110 stores W Z-element coefficient vectors. When filter 90 operates in extrapolation mode, external memory 110 stores W Z-element external coefficient vectors.

External memory 110 can also store the results of the filtering and processing operations.

Internal memory 130 can store data words, taps, and the results of the filtering process. When filter 90 operates in multiple channel FIR filtering and decimation modes, internal memory stores W Z-element data vectors. When filter 90 operates in a multi channel extrapolation mode internal memory 130 stores W Z"-element data vectors. When filter 90 operates in multiple channel IIR filtering, internal memory 130 stores W Z-element data/result vectors. A data/result vector initially comprises of data words, which are gradually replaced by the results of the IIR filtering. When filter 90 operates in a multiple channel echo canceling mode, internal memory 130 stores W Z-element data/sample vectors. A data/sample vector initially comprises of data words, which are gradually replaced by samples from signals which pass through the W communication channels.

When filter 90 operates in multi channel FIR filtering, IIR filtering, decimation and echo canceling modes, internal memory 130 stores W Z-element coefficient vectors. When filter 90 operates in extrapolation mode, internal memory 130 stores W Z"-element external coefficient vectors.

Internal memory 110 can also store the results of the filtering and processing operations.

For convenience of explanation a vector (either a data vector, an external data vector, a coefficient vector, an external coefficient vector, a data/result vector, an external data/result vector, a data/sample vector, an external data/sample vector) which is associated with the K'th communication channel is referred to as the K'th vector.

Filter 90 filters or processes data* vectors by a series of MAC functions, between a data* vector and a coefficient vector. A data* vector is a data vector, when the filter operates in FIR filtering mode, extrapolation mode and decimation mode, is a data/result vector, when the filter operates in IIR filtering mode and is a data/sample vector when the filter operates in echo cancellation mode;

In FIR filtering, IIR filtering, decimation and echo cancellation modes filter 90 performs Z MAC functions between two Z-element vectors at a time. In extrapolation mode filter 90 performs Z" MAC functions between two Z"-element vectors at a time. For convenience of explanation, a single series of Z" (when filter 90 is in extrapolation mode) or Z MAC function is referred to as an iteration.

Conveniently, MAC unit 170 receives these data, samples, coefficients and results from internal memory 130. Internal memory 130 is usually faster and smaller than external memory 110. Preferably, internal memory 130 comprises of first and second memory banks 140 and 150 (not shown in FIG. 2), wherein both sections are coupled in parallel to MAC unit 170, thus enabling MAC unit 170 to fetch a data, a result or a sample word and a tap simultaneously.

Conveniently, the data vectors, data/result vectors, the data/sample vectors associated with the different modes of filter 90 are stored in different portions of first memory bank 141 of internal memory 130. The coefficient vectors associated with the different modes of filter 90 are stored in different portions of second memory bank 150 of internal memory 130.

For example, the data and coefficient vectors associated with the FIR filtering mode are stored in the first W portions of first and second memory banks 140 and 150 accordingly, of internal memory 130. They are followed by the data and coefficient vectors associated with the IIR filtering mode, by the data and coefficient vectors associated with the decimation mode, by the data and coefficient vectors associated with the extrapolation mode and the echo canceling mode. For convenience of explanation, the address of the first memory word within first (second) memory bank 140 (150) associated with the FIR filtering mode is denoted DBASEF (CBASEF). the address of the first memory word within first (second) memory bank 140 (150) associated with the FIR filtering mode is denoted BBASEF (CBASEF). The address of the first memory word within first (second) memory bank 140 (150) associated with the IIR filtering mode is denoted DBASEI (CBASEI). The address of the first memory word within first (second) memory bank 140 (150) associated with the decimation mode is denoted DBASED (CBASED). The address of the first memory word within first (second) memory bank 140 (150) associated with the extrapolation mode is denoted DBASEE (CBASEE). The address of the first memory word within first (second) memory bank 140 (150) associated with the echo cancellation mode is denoted DBASEA (CBASEA).

Figure 2:
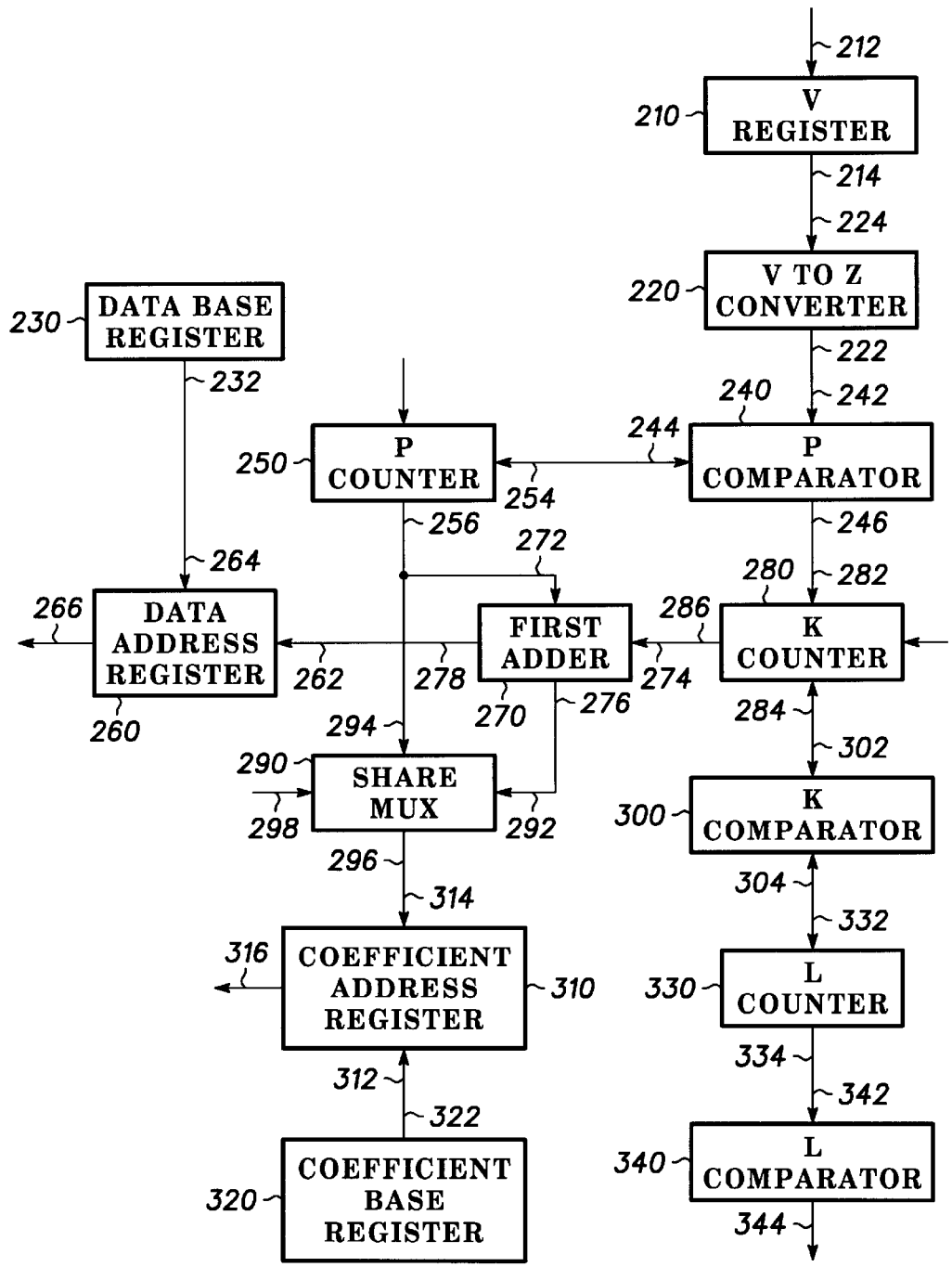
FIG. 2 is a schematic description of an address generation unit (i.e.—AGU), according to a preferred embodiment of the invention.

FIG. 2 is a schematic description of AGU 190, according to a preferred embodiment of the invention.

AGU 190 comprises of: V register (i.e.—vreg) 210, V to Z converter (i.e.—converter) 220, data base register (i.e. dbaser) 230, P counter (i.e.—pcount) 250, P comparetor (i.e.—pcomp) 240, data address adder (i.e.—dadd) 260, first adder 270, K counter (i.e.—kcount) 280, share multiplexer (i.e.—smux) 290, K comparator (i.e.—kcount) 300, coefficient address adder (i.e.—cadd) 310, coefficient base register (i.e.—cdaser) 320, L counter 330 and L comparetor (i.e.—lcomp) 340.

Vreg 210 has input 212 and output 224. Converter 220 has input 224 and output 222. Pcomp 240 has input 242 I/O 244 and output 246. Kcount 280 has input 282 and outputs 284 and 286. Kcomp 300 has I/O 302 and output 304. Lcount 330 has input 332 and I/O 334. Lcomp 340 has I/O 342 and output 344. Pcount 250 has I/O 254 and output 256. First adder 270 has inputs 272 and 274 and output 276. Smux 290 has inputs 292, 294 and 298 and output 296. Dbreg 230 has input 234 and output 232. Dadd 260 has input 264 and 262 and output 266. Cbreg 320 has input 324 and output 322. Cadd 310 has inputs 314 and 312 and output 316.

Output 214 of vreg 210 is coupled to input 224 of converter 220. Output 22 of converter is coupled to input 242 of pcomp 240. Output 246 of pcomp 240 is coupled to input 282 of kcount 280. I/O 284 of kcount 280 is coupled to I/O 302 of kcomp 300. Output 304 of kcomp 300 is coupled to input 332 of lcount 330. I/O of lcount 330 is coupled to I/O 342 of lcomp 340. I/O 244 of pcomp 240 is coupled to I/O 254 of pcount 250. Output 256 of pcount 250 is coupled to input 272 of first adder 270 and input 294 of smux 290. Output 286 of kcount 280 is coupled to input 274 of first adder 270. Output 276 of first adder 270 is coupled to input 292 of smux 290. Output 278 of first adder 270 is coupled to input 262 of dadd 260. Output 296 of smux 290 is coupled to input 314 of cadd 310. Output 323 of dbreg 230 is coupled to input 264 of dadd 266. Input 312 of cadd 310 is coupled to output 322 of cbreg 320. Input 243 of dbreg 230, input 324 of cbreg 320 and input 212 of vreg 210 are coupled to external memory 110, or internal memory 130.

Vreg 210 stores V, V is the length of a filter, or the number of taps of a filter. V can be defined by the filter programmer. Conveniently, Vreg 210 receives V from external memory 110. Preferably, Z and V are equal for all the channels. If they are not equal, filter 90 can operate in a single channel mode.

Converter 220 receives V and outputs Z, whereas $Z=2^F$ and $Z>=V>Z/2$. A filter is represented by a Z-element coefficient vector. Preferably, the coefficient vector is stored in second memory bank 150.

Pcount 250 is incremented after each read/write operation to internal memory 130, or after each MAC operation. The output signal of pcount 250 is denoted as P. Pcount 250 is reset by pcomp 240, when p>Z. Pcount 250 and pcomp 240 can be implemented by a programmable counter, which is reset when it count Z times. Kcount 280 counts the number of times pcount 250 is reset, denoted as K. Each time kcount 280 is incremented, the output signal from output 286 increments, and the output signal from output 286 increments by Z. Kcount 280 is reset by kcomp 300, when K>W, W being the number of channels.

Lcount 330 is incremented when kcount 280 is reset. The output signal of lcount 330 is referred to as L. Lcount 330 is incremented when all W data vectors undergo a single iteration. Lcount 330 is reset by lcomp 340, when L reaches a predetermined value. For example, in multiple channel FIR filtering, lcomp 330 is reset when L>Y/Z. In IIR mode lcomp 330 is reset when L>T. Y being the number of elements within an external data vector. T is the number of iteration required from a IIR filter.

Dbreg 230 stores a pointer. Conveniently, the pointer points to the first data word which is going to be processed when filter 90 starts to work. When filter 90 is initialized, the pointer usually points to the first element of the first data or data/result or data/sample vector.

Cbreg 320 stores a pointer. Conveniently, the pointer points to the first tap which is going to be processed when filter 90 starts to work. When filter 90 is initialized, the pointer usually points to the first element of the first coefficient vector.

First adder 270 receives the outputs signals from output 286 of kcount 280 and from pcount 250. The output signal of first adder 270 is sent to dadd 260, which adds the output signal of first adder 270 th the output signal of dbreg 230. The output signal, is an address within first memory bank 150. This signal is sent to first memory bank 140.

Smux 290 selects whether to send to cadd 310 the output signal of pcount 250 or the output signal of first adder 270.

Cadd 310 adds the output signal from smux 290 and the output signal from cbreg 320. The output signal, is an address within second memory bank 150. This signal is sent to second memory bank 150. When all the W channels are filtered by the same filter, smux 290 selects the output signal of pcount 250.

Figure 3:
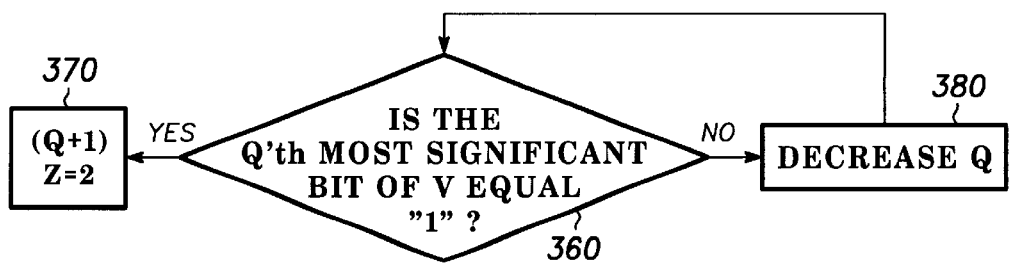
FIG. 3 is a flow chart of a method for converting a filter to a filter having $2^Z$ taps.

FIG. 3 is a flow chart of a method for converting a filter to a filter having $2^Z$ taps.

In query step 360 converter 220 checks if the Q'th bit of V equals "1". Q is an integer having values of 1 to QMAX, QMAX being the highest number of bits available for representing Z. For example, when Q=1, then converter checks the least significant bit of V. If the answer is "YES" then, step 360 is followed by step 370 in which Z is given the value of $2^Q$. Else, as step 360 is followed by step 380 un which Q is decreased. Step 380 is followed by step 360.

Figure 4:
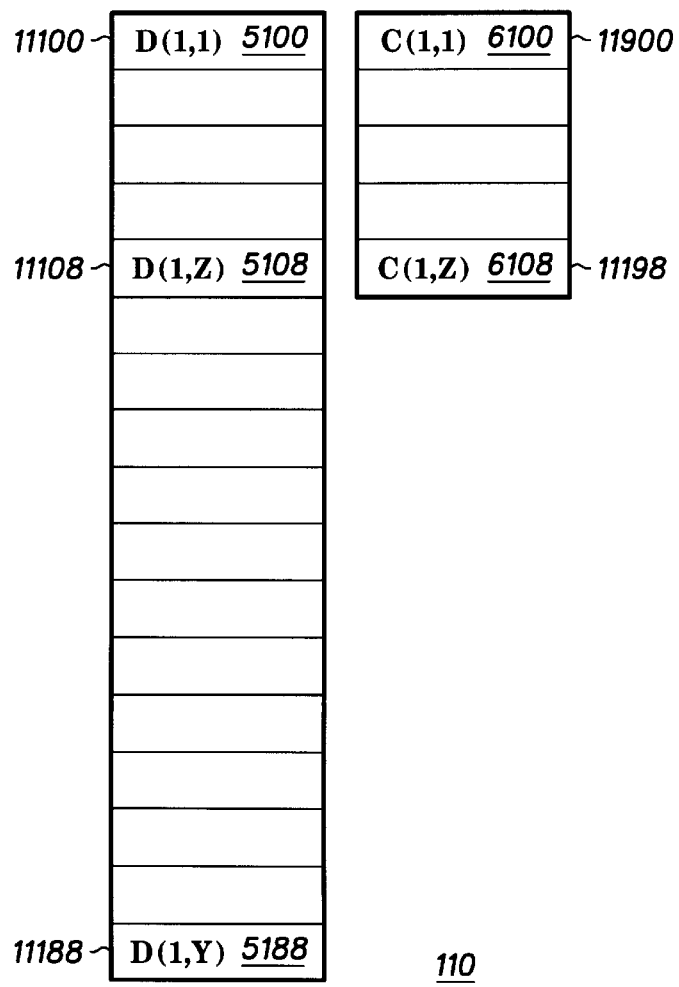
FIG. 4 is a schematic description of the general organization of data and coefficients which are associated with single channel, when the filter operates in various modes, according to a preferred embodiment of the invention.

FIG. 4 is a schematic description of the general organization of data and coefficients which are associated with single channel, when filter 90 operates in various modes, according to a preferred embodiment of the invention.

The data and coefficients are organized in that manner when filter 90 operates in one of the following modes: multiple or single channel FIR filtering, multiple or single channel decimation and multiple or single channel extrapolation.

Portion 111 of external memory 110 comprises of Y+Z memory words, from address 11100 to 11198. The first external data vector, comprising of data words D(1,1) to D(1,Y) 5100–5188, is stored in addresses 11100 to 11188. The first coefficient vector, comprising of Z taps C(1,1) to C(1,Z) 6100–6108, is stored in addresses 11190 to 11198.

Other portions of external memory store other external data vectors and other coefficient vectors. External memory 110 further stores the results of the FIR filtering, the decimation or extrapolation.

Filter 90 can contain a programmable look up table, for storing the location of various external data vectors and coefficient vectors. In the look up table, each channel is associated with an index K, defining the order of processing data associated to the various channels.

Figure 5:
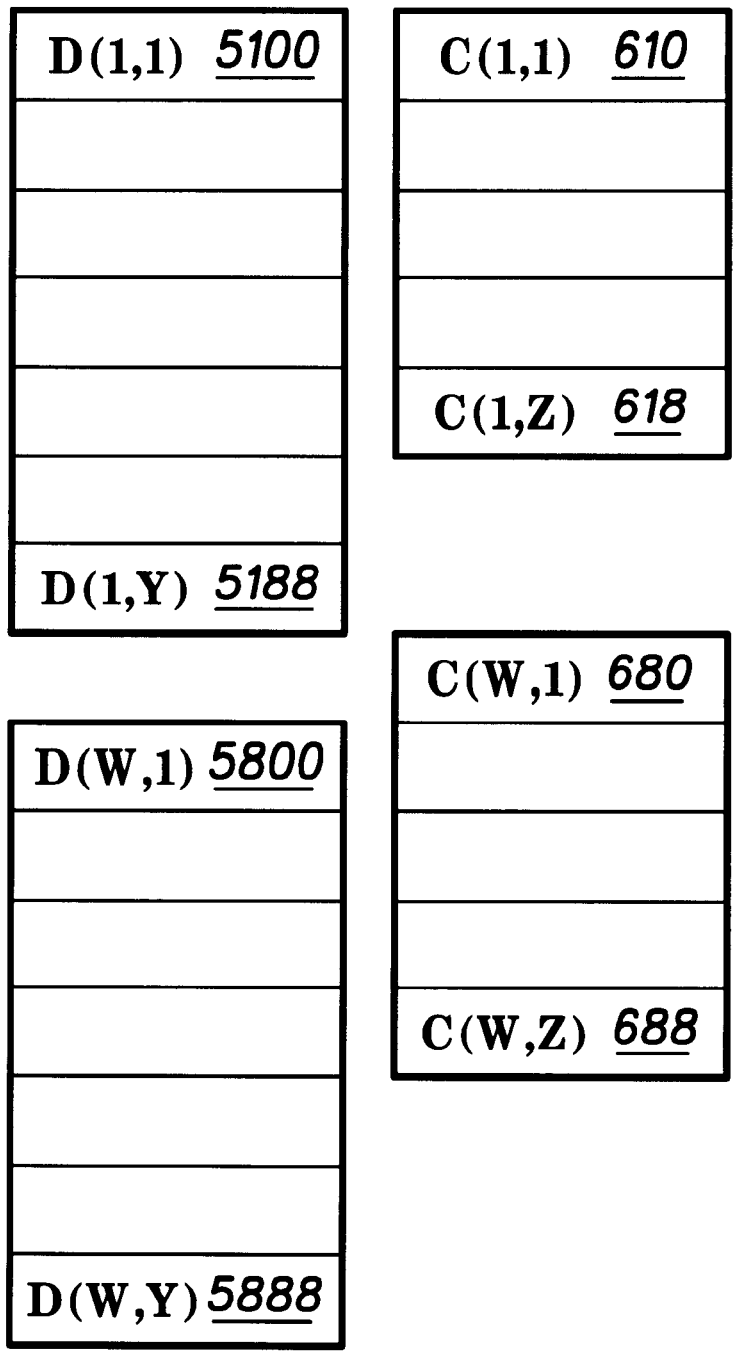
FIG. 5 is a schematic description of the general organization of data and coefficients which are associated with multiple channels, according to a preferred embodiment of the invention.

FIG. 5 is a schematic description of the general organization of data and coefficients which are associated with multiple channels, according to a preferred embodiment of the invention.

W channels are associated with W external data vectors and W coefficient vectors. D(K,b) is the b'th data element of the K'th external data vector, b having values of 1 to Y, K having values of 1 to W.

C(K,P) is the P'th coefficient element of the K'th coefficient vector, P having values of 1 to Z, K having values of 1 to W. Conveniently, each external data vector is stored in a separate portion of external memory 110.

Figure 6:
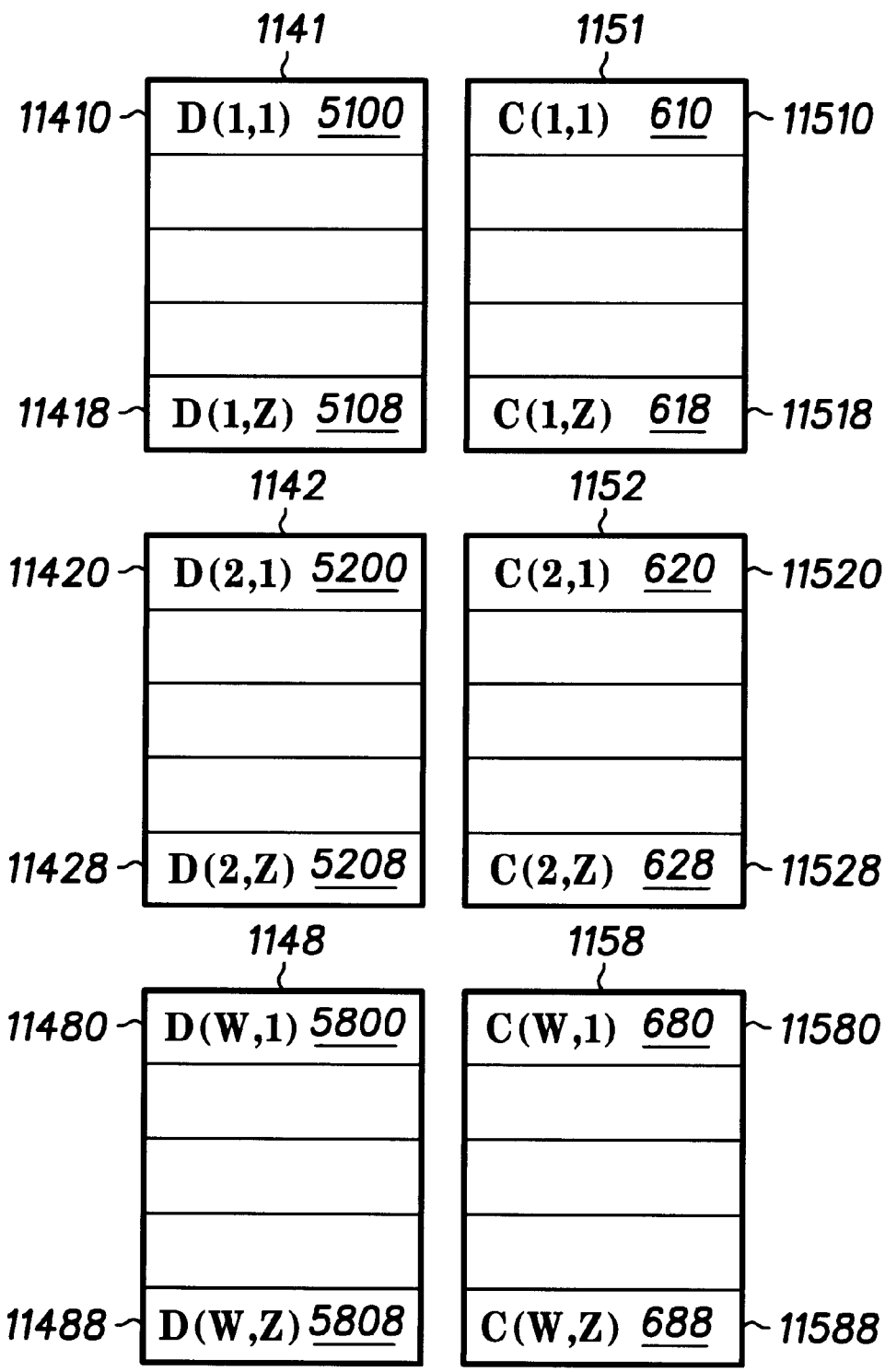
FIG. 6 is a schematic description of the general organization of data and coefficients within the internal memory, according to a preferred embodiment of the invention.

FIG. 6 is a schematic description of the general organization of data and coefficients within the internal memory, according to a preferred embodiment of the invention. FIG. 6 describes the initial content of internal memory 130, when filter 90 is activated in the following modes: multiple channel FIR filtering, multiple channel IIR filtering, multiple channel echo cancellation.

The first data vector, comprising of D(1,1)–D(1,Z) 5100–5108 is stored in first portion 1141 of first memory bank 140. First portion 1141 of first memory bank 1140 comprises of Z memory words 11410–11418. The second data vector, comprising of D(2,1)–D(2,Z) 5200–5208 is stored in second portion 1142 of first memory bank 140. Second portion 1142 of first memory bank 140 comprises of Z memory words 11420–11428. The W'th internal data vector, comprising of D(W,1)–D(W,Z) 5800–5808 is stored in the W'th portion 1148 of first memory bank 140. The W'th portion 1148 of first memory bank 140 comprises of Z memory words 11480–11488. Conveniently, the K'th portion located between the (K−1)'th portion and the (K+1)'th portion.

The first coefficient vector, comprising of C(1,1)–C(1,Z) 610–608 is stored in first portion 1151 of second memory bank 150. First portion 1151 of second memory bank 150 comprises of Z memory words 11510–11518. The second coefficient vector, comprising of C(2,1)–C(2,Z) 620–628 is stored in second portion 1152 of second memory bank 150. Second Portion 1152 of second memory bank 150 comprises of Z memory words 11520–11528. The W'th coefficient vector, comprising of D(W,1) to D(W,Z) 680–688 is stored in the W'th portion 1158 of second memory bank 150. The W'th portion 1158 of second memory bank 150 comprises of Z memory words 11580–11588.

The address of the P'th data word of the K'th data vector associated with the FIR filtering mode is DBASEF+(K*Z)+P. The address of the P'th tap of the K'th coefficient vector associated with the FIR filtering mode is CBASEF+(K*Z)+P.

A "mode switch" is defined as the process being done by filter 90, of stopping the operate in a certain mode (i.e.—first mode). The first mode can be any of the following modes: single or multi channel FIR filtering, IIR filtering, extrapolation, decimation and echo cancellation modes.

A unique aspect of filter 90 is its ability to perform a mode switch even before the filtering process has ended, whereas the change involves storing a negligible amount of status parameters. The storage of the status parameters allows filter 90 to resume working in the first mode, from the same location it stopped working in the first mode. Conveniently, the status parameters comprise of two addresses. The first address is the address the coefficient word which is supposed to be sent to MAC unit 160 in the next iteration. The second address is the address of data word (when filter 90 works in single or multi channel FIR filtering, extrapolation or decimation modes), or the address of the data/result word (when filter 90 works in single or multi channel IIR filtering mode), or the address of the data/sample word (when filter 90 works in single or multi channel echo cancellation mode) which are supposed to be sent to MAC unit 160 in the next iteration.

These address define both the channel which is going to be processes and the number of iterations already performed.

For example, if filter 90 stops to perform FIR filtering, and the next word to be filtered if the P'th word of the K'th channel. Filter 90 stores the address of the P'th data word and the P'th tap of the K'th channel, DAD(P,K)=(DBASEF+(K*Z)+P) and CAD(K,P)=(CBASEF+(K*Z)+P) respectively, in internal memory 130. When filter 90 commences the FIR filtering process, Kcount 280 reads K, pcount 250 reads P, dbreg 230 receives DBASEF and cbreg 320 receives CBASEF. P indicates that the K'th channel has undergone P−1 iterations.

Figure 7:
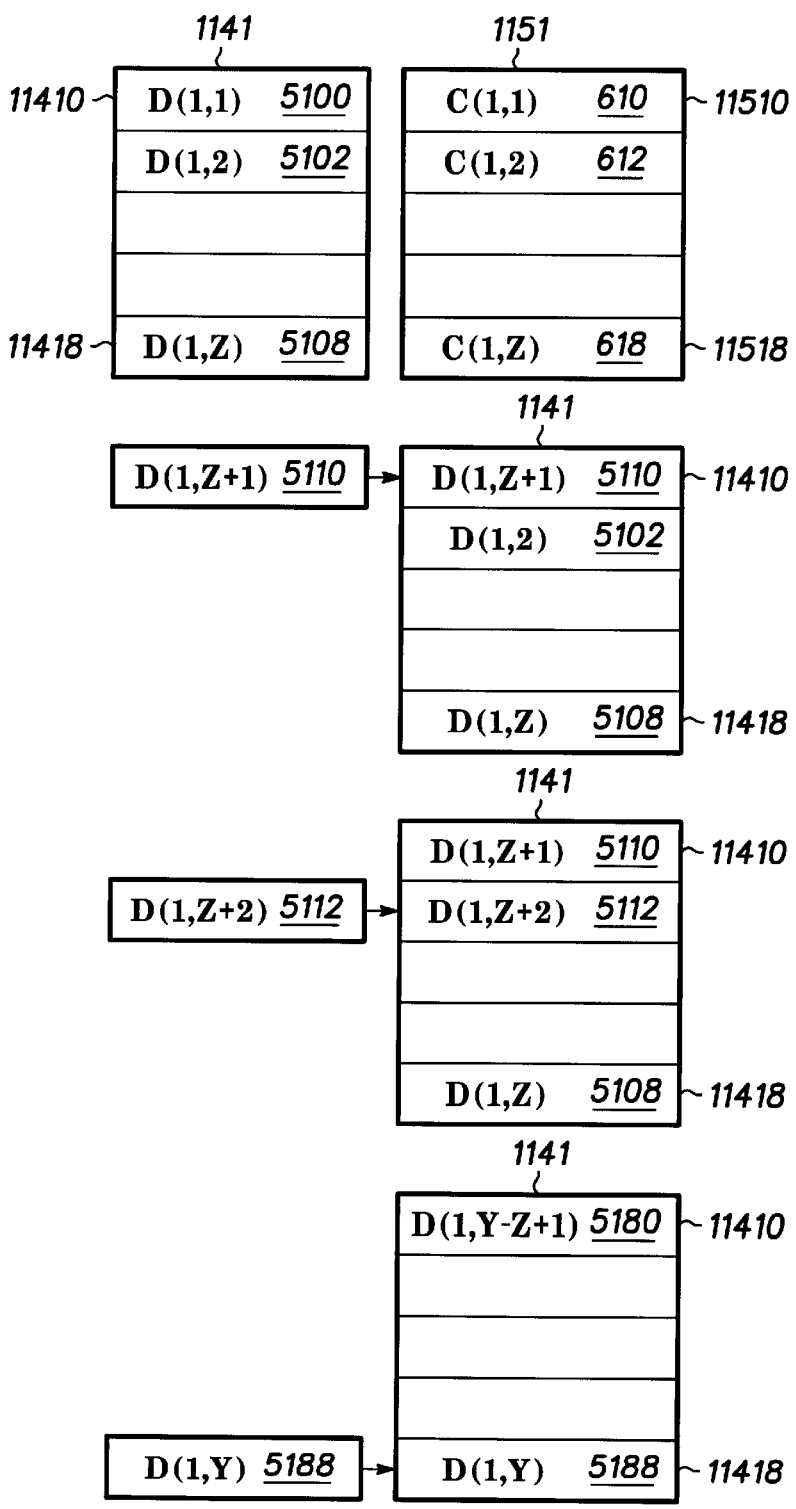
FIG. 7 is a schematic description of the content the first portion of the first memory bank, during various stages of a filtering process, according to a preferred embodiment of the invention.
Figure 8:
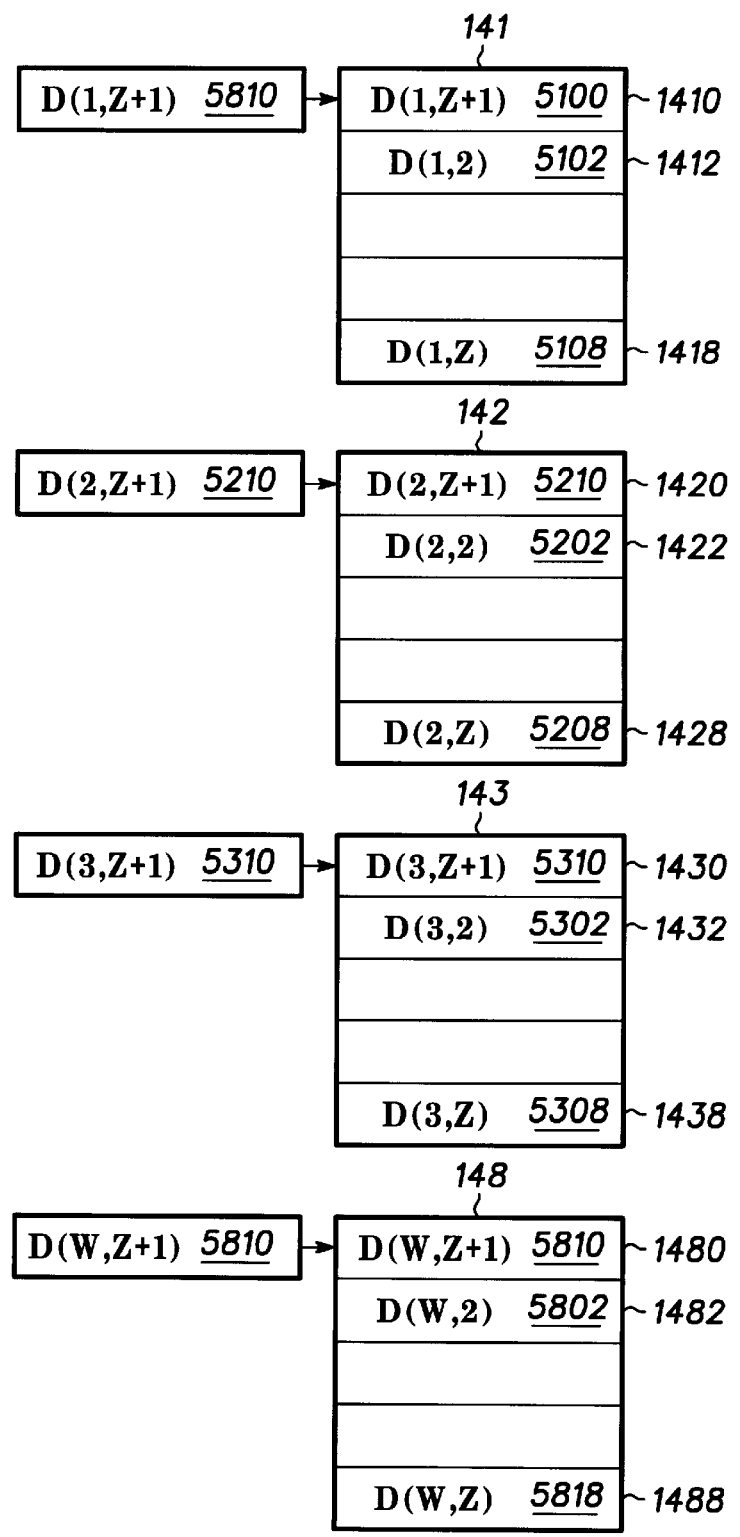
FIG. 8 is a schematic description of the general organization of data and coefficients which are associated with multiple channels, in different stages of a FIR filtering process, according to a preferred embodiment of the invention.
Figure 9:
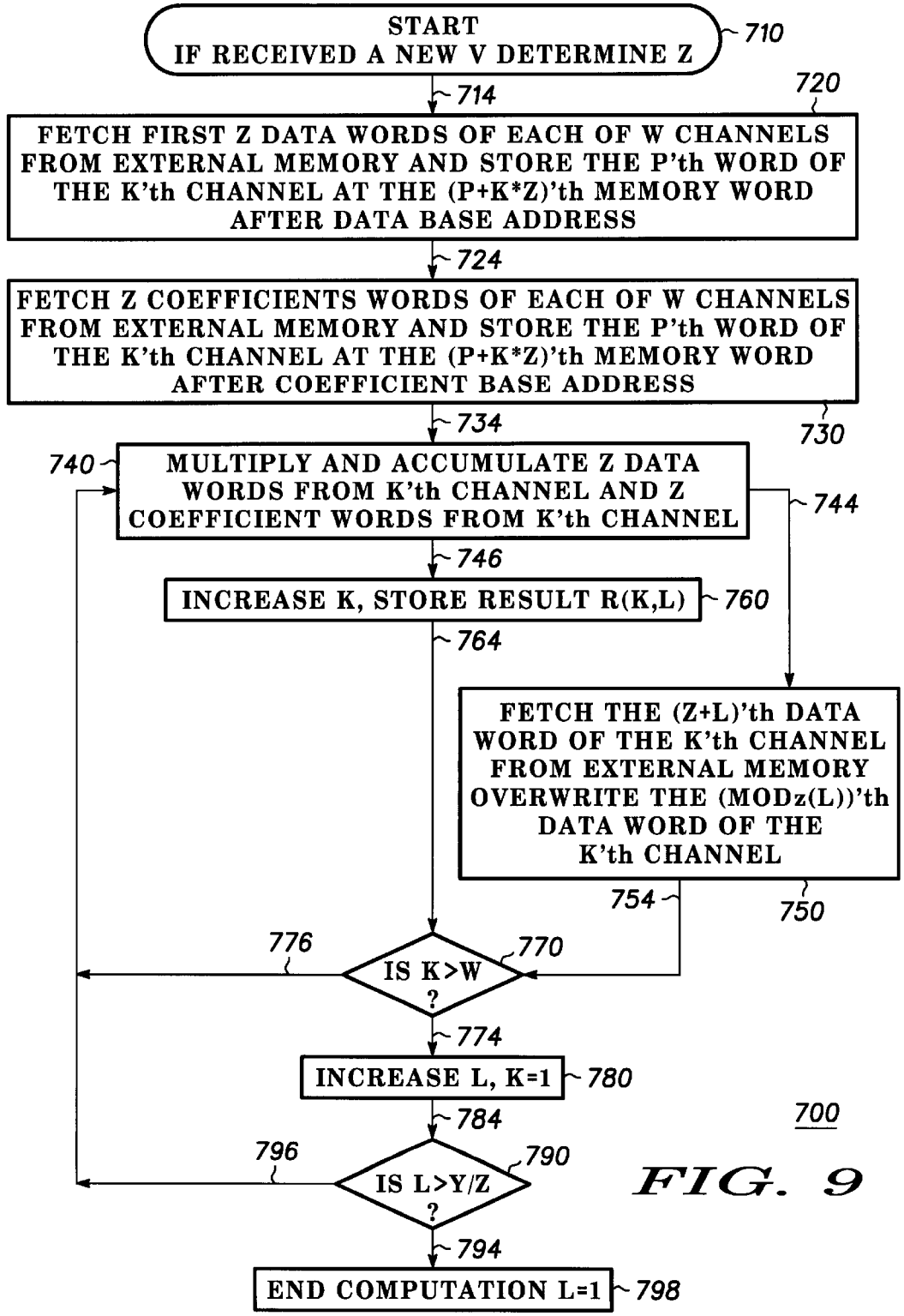
FIG. 9 is a flow chart of a method for performing FIR filtering, according to a preferred embodiment of the invention.

FIG. 9 is a flow chart of a method 700 for performing a FIR filter, according to a preferred embodiment of the invention. FIG. 8 is a schematic description of the general organization of data and coefficients which are associated with multiple channels, in different stages of a FIR filtering process, according to a preferred embodiment of the invention. FIG. 7 is a schematic description of the content the first portion 141 of first memory bank 140, during various stages of a FIR filtering process, according to a preferred embodiment of the invention.

Multiple or single channel FIR filtering is defined by the following:

$$R(K, L) = \sum_{i=1}^{Y} C(K, i) * D(K, L-i)$$

wherein:
i is an index having values of 1 to Y. K is an index, having values of 1 to W. L is an index, having values of 1 to Y. Y is the length of an external data vector. R(K,b) is the b'th result element in the K'th external result vector, b is an index having values of 1 to Z+Y. C(K,i) is the i'th tap of the K'th coefficient vector. D(K,L-i) is the (L-i)'th data element in the K'th external data vector.

Each iteration of FIR filtering involves a series of MAC functions between Z element data vector and a Z element coefficient vector. The K'th data vector has Z elements, while the K'th external data element has Y elements, thus there is a need to fetch data elements of the K'th external data vector after processing the Z elements of the K'th data vector.

Method 700 comprises of the following steps:

Initialization step 710. In step 710 filter 90 checks what is V and accordingly changes Z. $Z=2^F$ and Z>=V>Z/2. As indicated by path 714 and 724, step 710 is followed by step 720, which is followed by step 730.

Figure 12:
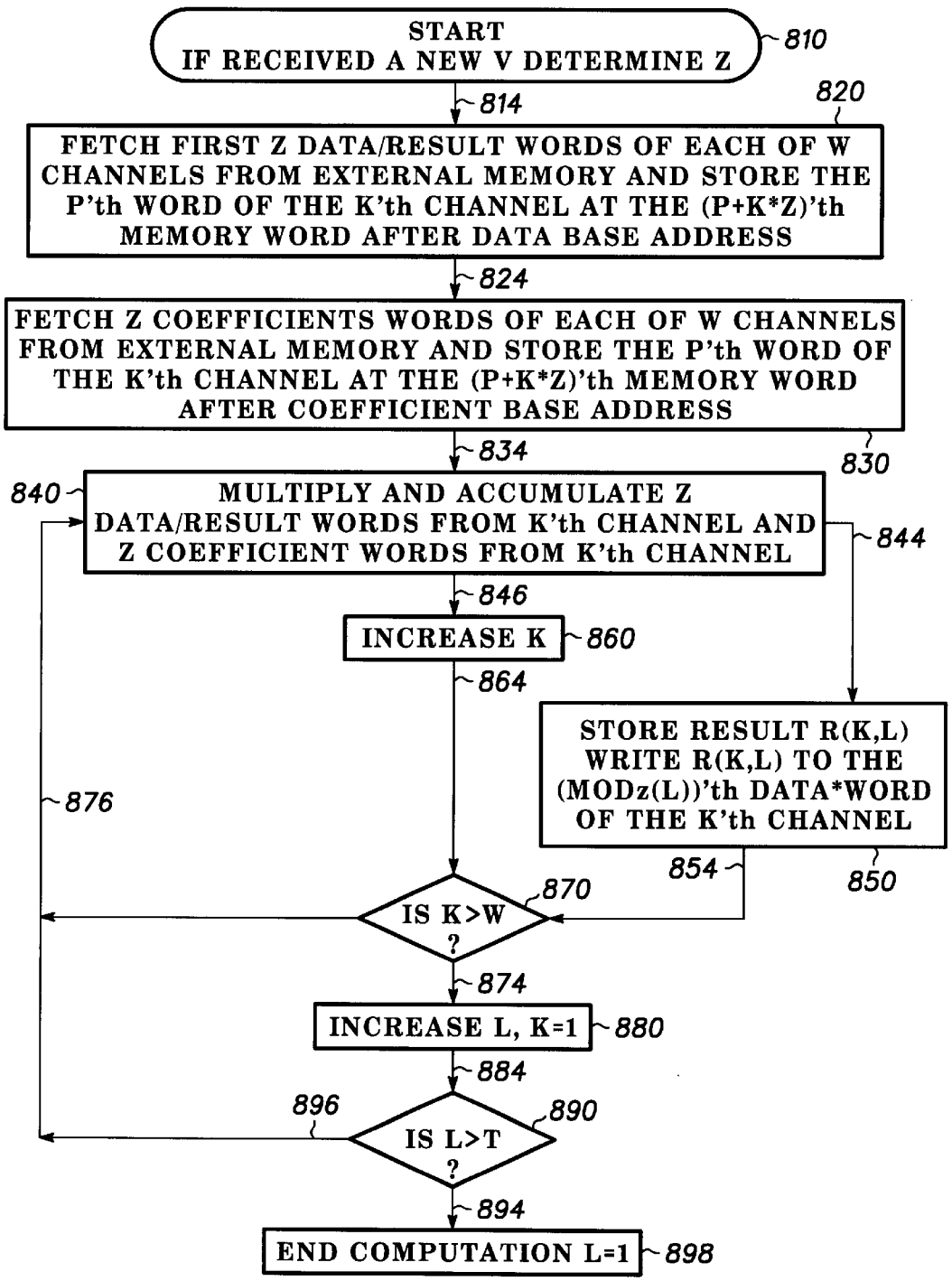
FIG. 12 is a flow chart of a method for performing IIR filtering, according to a preferred embodiment of the invention.

In steps 720 and 730, and as explained in accordance with FIG. 12, the first Z data elements of the K external data vectors, and K coefficients vectors are sent to internal memory 130, so that the address of the P'th data word of the K'th data vector is DBASE+(K*Z)+P. The address of the P'th tap of the K'th coefficient vector is CBASE+(K*Z)+P. As indicated by path 734, step 730 is followed by step 740.

In step 740, filter 90 performs an iteration—it executes Z MAC operations between the K'th data vector and the K'th coefficient vector. For example, the first set of MAC operations is done between the first data vector, comprising of the first Z elements D(1,1) to D(1,Z) 5100–5108 of the first external data vector, and the first coefficient vector comprising og C(1,1) to C(1,Z) 610–618.

As indicated by paths 744 and 746, step 740 is followed by steps 750 and step 760. Step 750 is conveniently performed in parallel to steps 760–790.

During step 760, the result R(K,L) of the L'th iteration involving the K'th external data vector is stored in external memory 110. K is increased, so that the (k+1)'th data vector undergoes filtered during the next execution of step 740.

As indicated by path 764, step 760 is followed by query step 760. In query step 760, filter 90 checks if K>W. If the answer is "NO" step 770 is followed by step 740, as indicated by path 776. If the answer is YES, indicating that all W data vectors undergone L'th iteration, then L is increased and K is reset.

As indicated by path 784, step 780 is followed by query step 790. In query step 790, filter 90 checks if L>W. If the answer is "NO" step 790 is followed by step 740, as indicated by path 796. If the answer is YES, indicating that all the elements of the W external data vectors were filtered, step 790 is followed by step 798 in which the filtering process ends and L is reset.

Steps 740–790 provide that all the elements of the W external data vectors are filtered.

As indicated by path 744, during the execution of steps 760–790 and even while executing step 740 in accordance to the (K+1)'th data vector, the (K+L)'th data word of the K'th external data vector is fetched from external memory 110 and replaces the (MODz(L))'th data word of the K'th data vector.

For example, and as shown in FIG. 7, after the first data vector comprising of the first Z elements of the first external data undergone an iteration, the (Z+1)'th data word D(1,Z+1) 5110 of the first external data vector is fetched from external memory 110 and replaces the former first data word 5100 of the first data vector. The fetching og D(1,Z+1) 5110 can occur while another data vector undergoes an iteration. After the first Z data elements of all W external data vectors are processed, the first data vector, which comprises of the D(1,Z+1) 5110, and D(1,2) to D(1,Z) 5102–5108 undergoes an iteration. The iteration is followed by fetching the (Z+2)'th data element D(1,Z+2) 5112 of the first external data and replacing D(1,2) 5112 of the first data vector. After Y–Z iterations, D(1,Y) 5188 is fetched and replaces D(1,Y–Z) 5178, thus the first data vector comprises of D(1,Y–Z+1)–D(Y) 5180–5188. The filtering process ends after Y iterations.

For example, and as shown in FIG. 8, after the K'th data vector comprising of the first Z data elements of the K'th external data vector undergoes a single iteration, the first data element of the K'th data vector is replaced by the (W+1)'th data element of the K'th external data vector. After the first data vector, comprising of the first Z elements of the first external data vector, undergo an iteration, the (Z+1)'th data element D(1,Z+1) 5110 of the first external data vector element is fetched and replaces the first data word D(1,1) 5100 of the first data vector. After the second data vector, comprising of the first Z elements of the second external data vector, undergo an iteration, the (Z+1)'th data element D(2,Z+1) 5210 of the second external data vector element is fetched and replaces the first data word D(2,1) 5200 of the second data vector. After the third data vector, comprising of the first Z elements of the third external data vector, undergo an iteration, the (Z+1)'th data element D(3,Z+1) 5310 of the first external data vector element is fetched and replaces the first data word D(3,1) 5300 of the third data vector. After the W'th data vector, comprising of the first Z elements of the W'th external data vector, undergo an iteration, the (Z+1)'th data element D(W,Z+1) 5810 of the W'th external data vector element is fetched and replaces the first data word D(W,1) 5800 of the W'th data vector.

Figure 10:
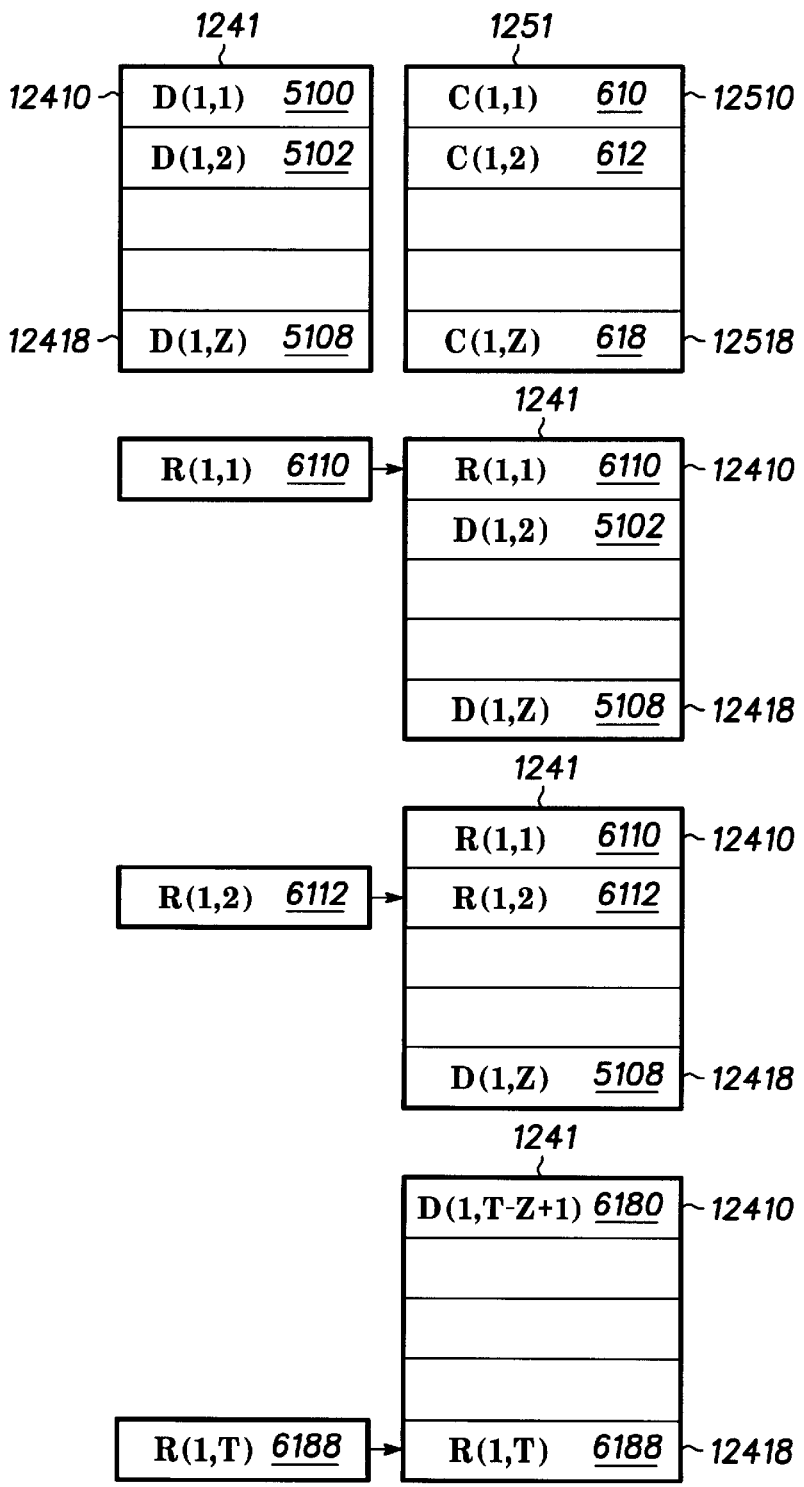
FIG. 10 is a schematic description of the content the (W+1)'th portion of the first memory bank, during various stages of a filtering process, according to a preferred embodiment of the invention.
Figure 11:
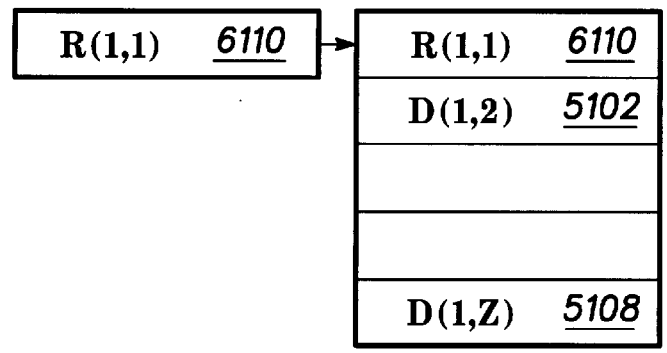
FIG. 11 is a schematic description of the general organization of data and coefficients which are associated with multiple channels, in different stages of an IIR filtering process, according to a preferred embodiment of the invention.
Figure 11:
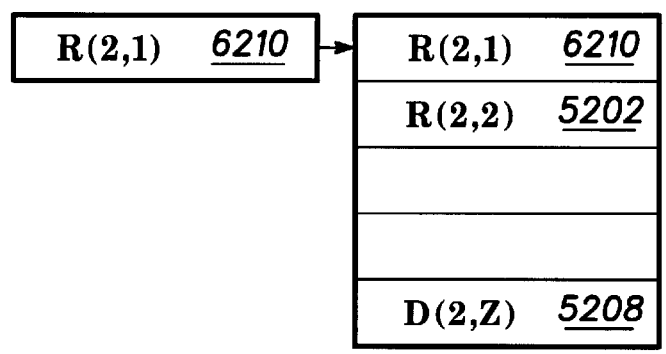
Figure 11:
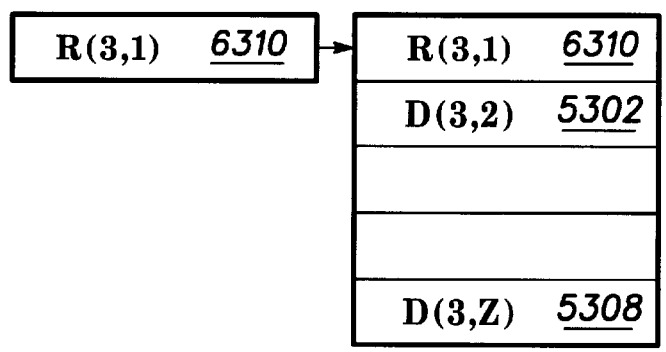
Figure 11:
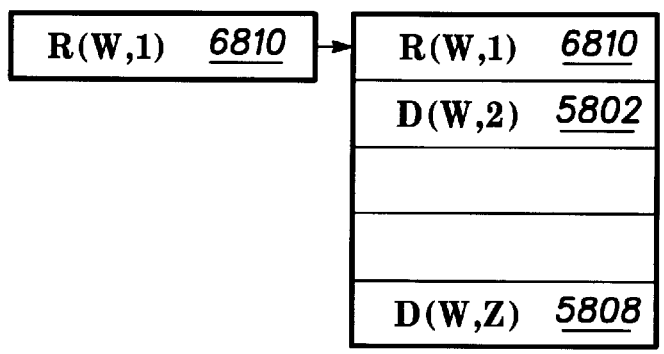

FIG. 12 is a flow chart of a method 800 for performing IIR filtering, according to a preferred embodiment of the invention. FIG. 11 is a schematic description of the general organization of data and coefficients which are associated with multiple channels, in different stages of a IIR filtering process, according to a preferred embodiment of the invention. FIG. 10 is a schematic description of the content the (W+1)'th portion 1241 of first memory bank 140, during various stages within the filtering process, according to a preferred embodiment of the invention.

Multiple or single channel IIR filtering is defined by the following equation:

$$R(k, p) = \sum_{i=1}^{T-Z} C(k, i) * R(k, p-i) + \sum_{i=1}^{Z} C(k, i) * D(k, p-i)$$

T is an index denoting the number of iteration executed by the IIR filter.

IIR filtering of a single channel is performed by a series of MAC operations between a data/result vector having Z data element and a Z element coefficient vector. The K'th result/data vector and coefficient vector are stored in the (W+K)'th portion of first and second memory bank 140 and 150 accordingly. For example, the first, second, the third, and the W'th data vectors are stored in (W+1)'th, (W+2)'th, (W+3)'th and 2W'th portions 1241, 1242, 1243 and 1248 accordingly of first memory bank 140. The first, second, the third, and the W'th coefficient vectors are stored in (W+1)'th, (W+2)'th, (W+3)'th and 2W'th portions 1251, 1252, 1253 and 1258 accordingly of second memory bank 150. (W+1)'th portion 1241 of first memory bank 140 comprises of Z memory words 12410–12418.

Method 800 comprises of the following steps:

Initialization step 810. In step 810 filter 90 checks what is V and accordingly changes Z. $Z=2^F$ and $Z>=V>Z/2$. As indicated by path 814 and 824, step 810 is followed by step 820, which is followed by step 830.

In steps 820 and 830, K data vectors and K coefficients vectors are sent to internal memory 130, so that the address of the P'th data word of the K'th data vector is DBASEI+(K*Z)+P. The address of the P'th tap of the K'th coefficient vector is CBASEI+(K*Z)+P. As indicated by path 834, step 830 is followed by step 840.

In step 840, filter 90 performs an iteration—it executes Z MAC operations between the K'th data/result vector and the K'th coefficient vector. For example, the first set of MAC operations is done between the Z elements D(1,1) to D(1,Z) 5100–5108 of the first data/result and the Z elements C(1,1) to C(1,Z) 610–618 of the first coefficient vector.

As indicated by paths 844 and 846, step 840 is followed by steps 850 and step 860. Step 850 is conveniently performed in parallel to steps 860–890.

During step 860, K is increased, so that the next execution of step 840 involves the (K+1)'th data and coefficient vector.

As indicated by path 864, step 860 is followed by query step 860. In query step 860, filter 90 checks if k>W. If the answer is "NO" step 870 is followed by step 840, as indicated by path 876. If the answer is YES, indicating that all W internal vectors were filtered during the current (i.e.—L'th) iteration, then L is increased and K is reset.

As indicated by path 884, step 880 is followed by query step 890. In query step 890, filter 90 checks if L>T. If the answer is "NO" step 890 is followed by step 840, as indicated by path 896. If the answer is YES, indicating that T iterations were executed, step 890 is followed by step 898 in which the filtering process ends and L is reset.

Steps 840–890 provide that all channels were filtered T times.

As indicated by path 844, during the execution of steps 860–890 and even while executing step 840 in accordance to the (K+1)'th data/result and coefficient vectors, the result R(K,L) of the L'th iteration associated with the K'th data/result vector previous replaces the (MODz(L))'th word of the K'th data/result vector.

For example, and as shown in FIG. 10, after the first data vector, comprising of the first Z elements of the first external data/result vector undergone a first iteration, the result R(1,1) 6110 of the iteration replaces the former first data word 5100 of the first data/result vector, stored at the (W+1)'th portion 1241 of first memory bank 140. The result is fetched while other data/result vectors undergo a first iteration. After the W data/result vectors undergo a first iteration, the first data/result vector, comprising of R(1,1) 6110, and D(1,2) to D(1,Z) 5102–5108 undergoes an iteration. This iteration is followed by replacing the second data word D(1,2) 5112 of the first data/result vector with the result R(1,2) 6112 of the iteration. After T iterations, D(1,T) 6188 is fetched and replaces R(1,Y-Z) 6178. The filtering process ends after T iterations.

For example, and as shown in FIG. 11, the results of the first iteration of each of the W data/result vectors replaces the prior first data element of the data/result vector. R(1,1) 6110 replaces D(1,1) 5100, R(2,1) 6210 replaces D(2,1) 5200, R(3,1) 5310 replaces D(3,1) 5300 and R(W,1) 5810 replaces D(W,1) 5800.

Figure 13:
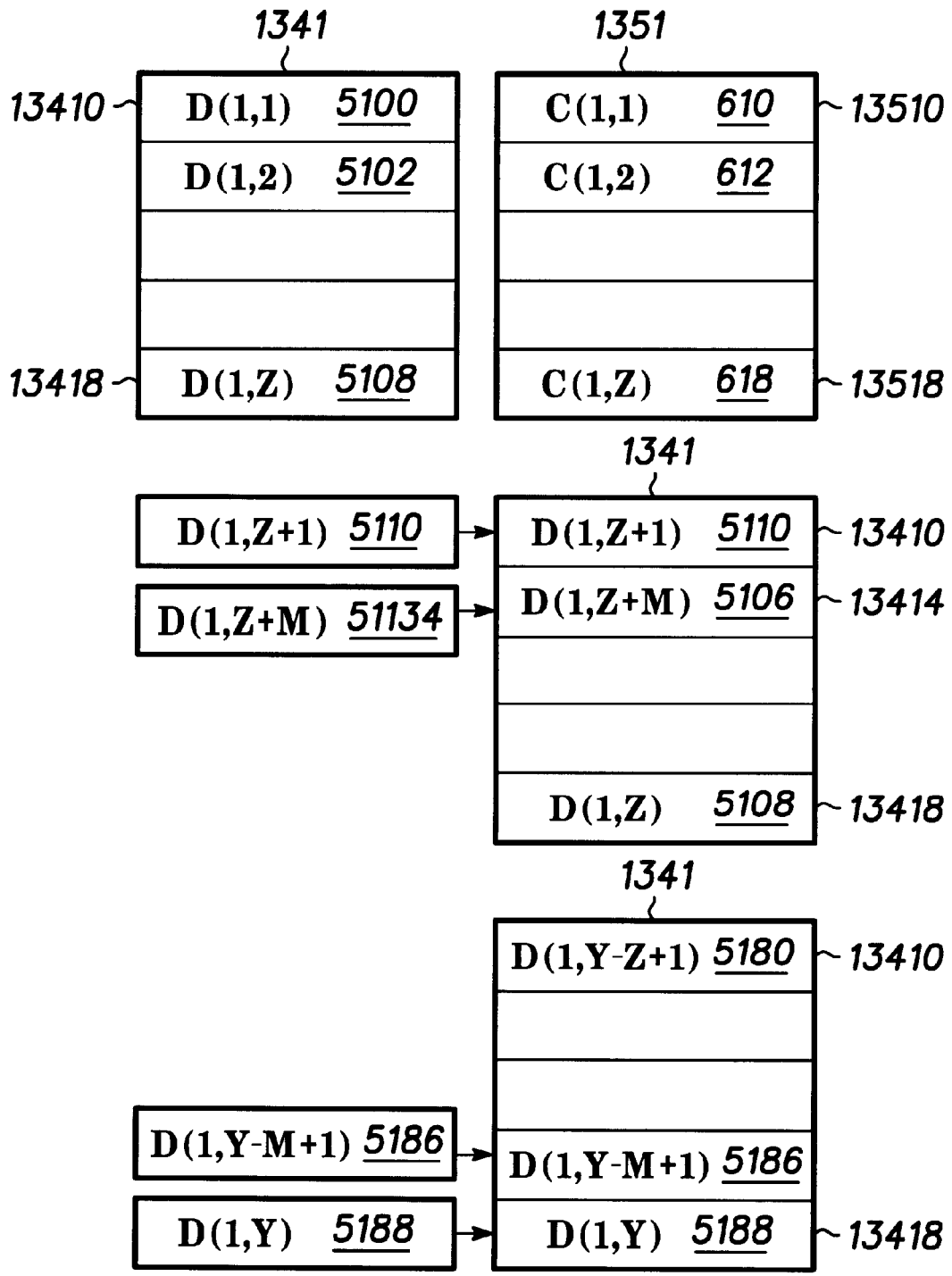
FIG. 13 is a schematic description of the content the (2W+1)'th portion of the first memory bank, during various stages of a decimation process, according to a preferred embodiment of the invention.
Figure 14:
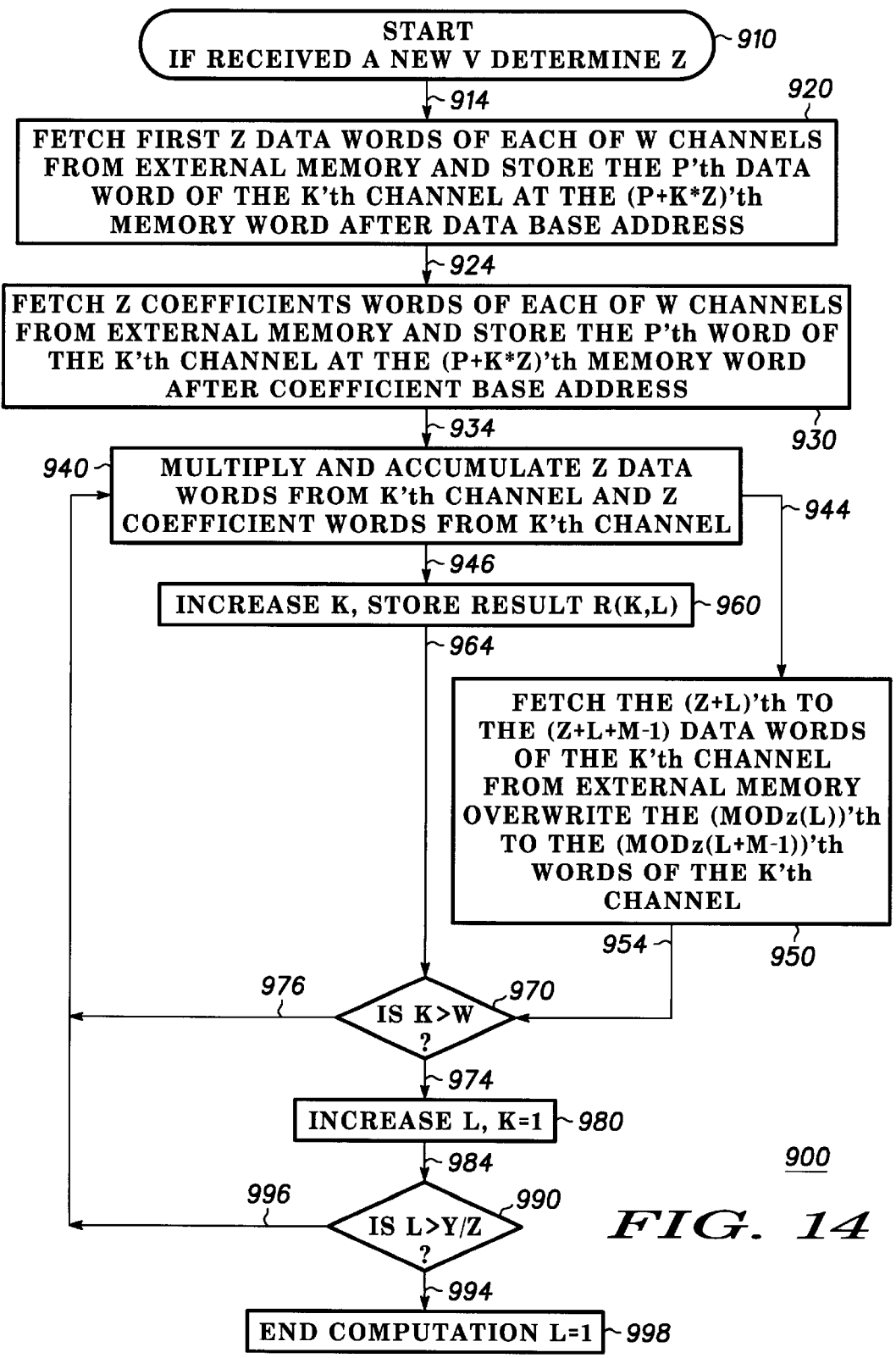
FIG. 14 is a flow chart of a method for performing a decimation, by factor of M, according to a preferred embodiment of the invention.

FIG. 14 is a flow chart of a method 900 for performing a decimation, by factor of M, according to a preferred embodiment of the invention. FIG. 13 is a schematic description of the content the (2W+1)'th portion 1341 of first memory bank 140, during various stages of a decimation process, according to a preferred embodiment of the invention.

Decimation involves FIR filtering. Method 900 is analogues to method 700, but step 950 involves fetching M data words from external memory 110, instead of fetching a single data word during step 750. In step 990 the number of iterations 1 is compared to Y/(M*Z) instead of Y/Z, as in step 790.

For example, and as shown in FIG. 13, after the first data vector comprising of the first Z elements of the first external data undergone an iteration, D(1,1+Z) to D(1,Z+M) 5110–5114 are fetched from external memory 110 and replace D(1,1) to D(1,M) 5100–5104 of the first data vector. D(1,1+Z) to D(1,Z+M) 5110–5114 are fetched while filter 90 processes other data vectors. After the W data/result vectors undergo a first iteration, the first data vector, comprising of D(1,Z+1) to D(1,Z+M) 5110–5114 and D(1,M+1) to D(1,Z) 5106–5108 undergoes a second iteration. After ((Y-Z)/M)-1 iterations, D(1,Y-M+1) to D(1,Y) 5186–5188 are fetched and replace D(1,Y-2M) to D(1,Y-M) 5178 to 5184. The filtering process ends after (Y+Z)/((M-1)*Z) iterations.

Figure 15:
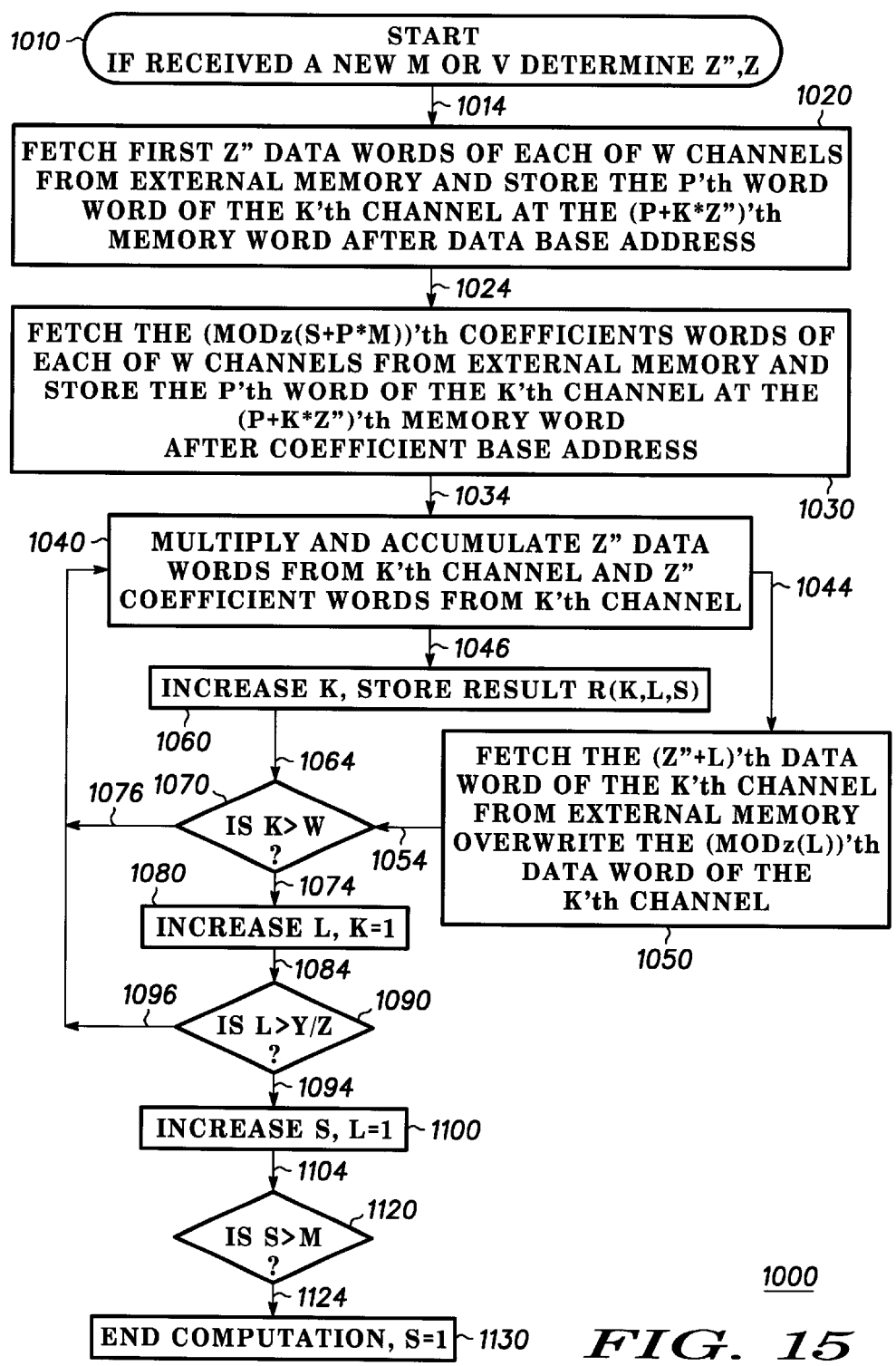
FIG. 15 is a flow chart of a method 1000 for performing an extrapolation, by factor of M, according to a preferred embodiment of the invention.
Figure 16:
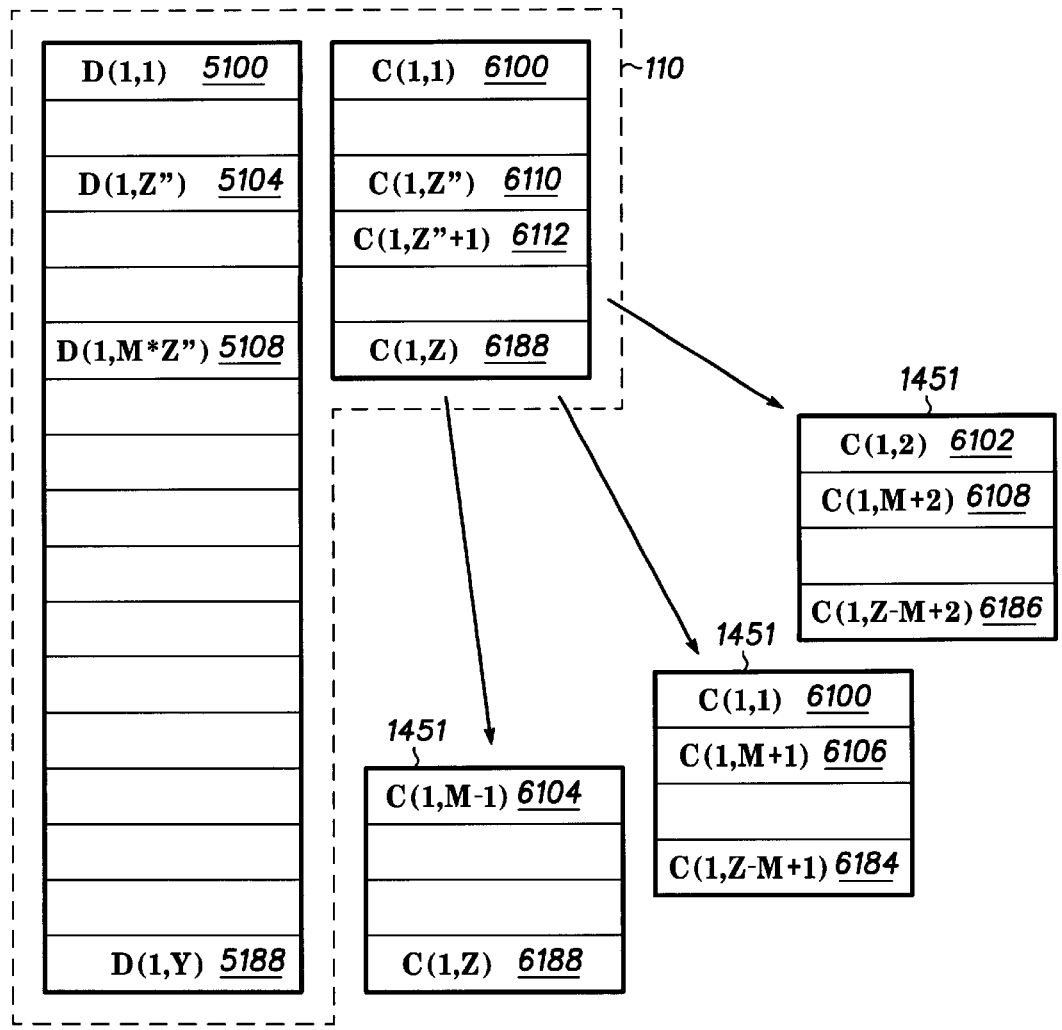
FIG. 16 is a schematic description of the general organization of data and coefficients which are associated with single channel, according to a preferred embodiment of the invention.

FIG. 15 is a flow chart of a method 1000 for performing an extrapolation, by factor of M, according to a preferred embodiment of the invention. FIG. 16 is a schematic description of the general organization of data and coefficients which are associated with single channel, according to a preferred embodiment of the invention.

Extrapolation involves FIR filtering. Method 1000 is analogues to method 700, but it involves, performing fewer MAC operation in each iteration, and involving smaller coefficient and data vectors.

In extrapolation mode, each channel is associated with a Z element coefficient vector, referred to as external coefficient vector. Internal memory 130 stores a portion of the external coefficient vector. When the extrapolation factor is M, then internal memory stores a (Z/M)=Z" element coefficient vector. An iteration comprises of Z" MAC functions between a Z" element coefficient vector and a Z" element data vector. A data vector comprises of Z" consecutive data words. A coefficient vector comprises of the (S*M+J)'th elements of the external coefficient vector, wherein J is an index having values of 1 to Z", S is a index having values of 0 to M-1. For example, if Z=64 and M=4 then there is a single external coefficient vector, and there are 4 coefficient vectors, each having 16 elements. The first coefficient vector comprises of the 1'th, 5'th, 9'th, 13'th, 17'th, 21'th , 25'th , 29'th, 33'th, 37'th, 41'th, 49'th, 53'th, 57'th, and the 61'th elements of the external coefficient vector.

For example, the external coefficient vector associated with the first channel (i.e.—first external coefficient vector) is stored within external memory 110 and comprises of C(1,1) to C(1,Z) 6100 to 6188. First external coefficient vector is split to M coefficient vectors. One out of the M coefficient vectors is fetched to internal memory 130. After this vector is used to filter data, another coefficient vector is fetched. Initially, the Z" element coefficient vector which comprises of C(1,1), C(1,M+1) . . . C(1,Z-M+1) 6100, 6106 . . . 6184, is sent to the (3W+1)'th portion of second memory bank 150. The next vector to be fetched to the (3W+1)'th portion of second memory bank 150 comprises of C(1,2), C(1,M+2) ... C(1,Z−M+2) 6102, 6108 ... 6186. The M'th coefficient vector which is fetched to the (3W+1)'th portion of second memory bank 150 comprises of C(1,M−1) ... C(1,Z) 6104 to 6188.

Method 1000 comprises of the following steps:

Initialization step 1010. In step 1010 filter 90 checks what are V and M and accordingly changes Z". Z"=Z/M, $Z=2^F$ and Z>=V>Z/2. As indicated by path 1014 and 1024, step 1010 is followed by step 1020, which is followed by step 1030. In steps 1020 and 1030, K data vectors and K coefficients vectors are sent to internal memory 130, so that the address of the P'th data word of the K'th data vector is DBASEE+(K*Z")+P. The address of the P'th tap of the K'th coefficient vector is CBASEE+(K*Z")+P. As indicated by path 1034, step 1030 is followed by step 1040.

A data vector comprises of Z" consecutive data words. The coefficient vector comprises of the (S*M+t)'th elements of the external coefficient vector. In step 1040, filter 90 executes Z" MAC operations between the K'th data vector stored and the K'th coefficient vector.

As indicated by paths 1044 and 1046, step 1040 is followed by steps 1050 and step 1060. Step 1050 is conveniently performed in parallel to steps 1060–1090. During step 1060, the L'th Result R(K,L,S) associated to K'th communication channel is stored in external memory 110, and K is increased.

As indicated by path 1064, step 1060 is followed by query step 1070. In query step 1070, filter 90 checks if K>W. If the answer is "NO" step 1070 is followed by step 1040, as indicated by path 1076. If the answer is YES, indicating that all W data vectors undergone L iteration, than L is increased and K is reset.

As indicated by path 1084, step 1080 is followed by query step 1090. In query step 1090, filter 90 checks if L>(Y/(W*Z)). If the answer is "NO" step 1090 is followed by step 1040, as indicated by path 1096. If the answer is YES, indicating that all the Y elements of data of all W external data vectors were filtered by Z" coefficient vectors, step 1090 is followed by step 1100.

In step 1100 L is reset and S is increased.

As indicated by path 1104, step 1100 is followed by step 1110. In step 1110 filter 90 checks if S>M, if the answer is "YES", indicating that the extrapolation process ended, then step 1100 is followed by step 1118, as indicated by path 1114. If the answer is "NO", step 1100 is followed by step 1040.

As indicated by path 1044, during the execution of steps 1060–1090 in accordance to the K'th data vector, and even while executing step 1040 in accordance with another data vector, the (Z+L)'th data word of the K'th external data vector replaced the (MODz(L))'th data word of the K'th data vector.

Figure 17:
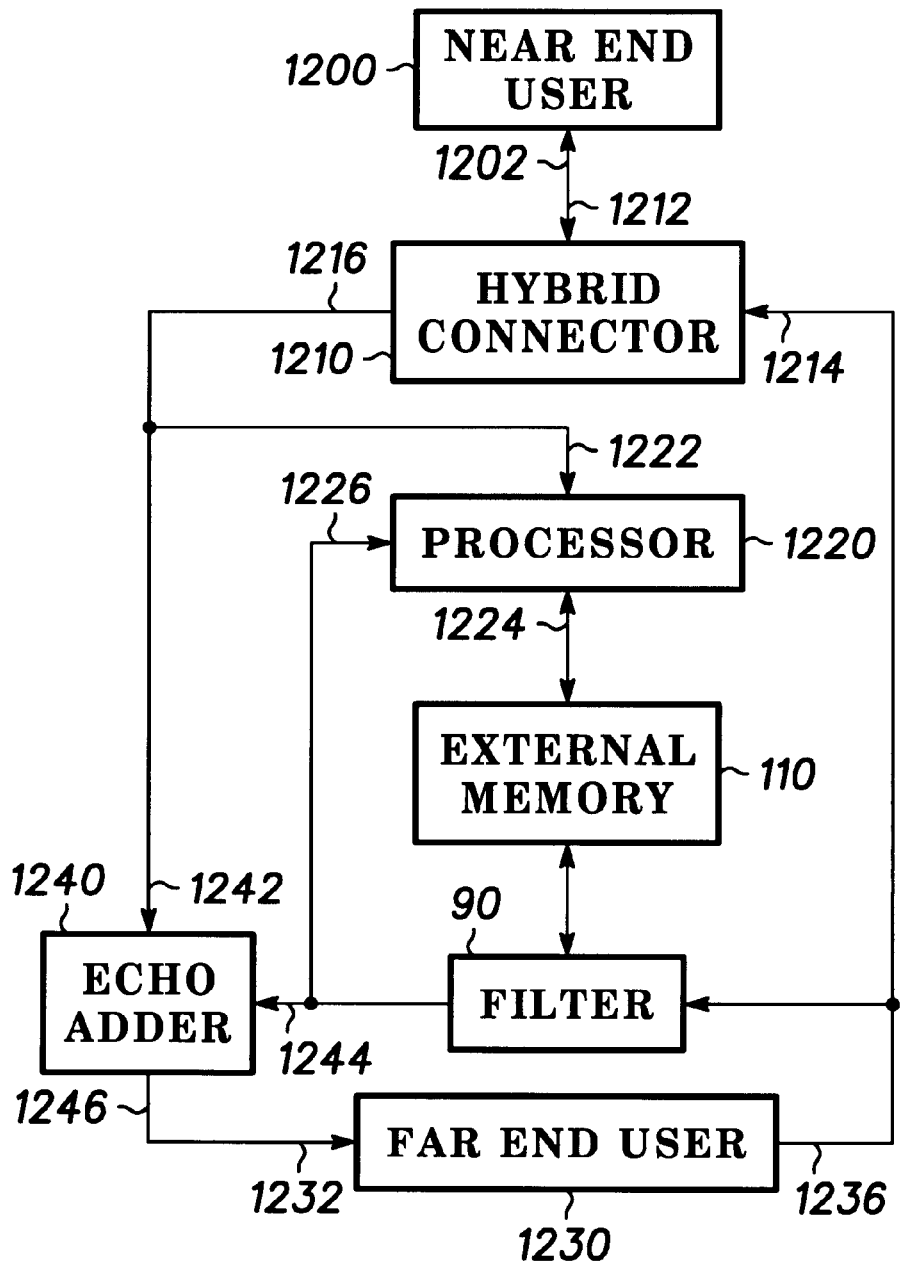
FIG. 17 is a schematic embodiment of a filter, coupled to a near end user, to a far end user, to a hybrid connector, to an echo adder, to a processor and to an external memory, according to a preferred embodiment of the invention.
Figure 18:
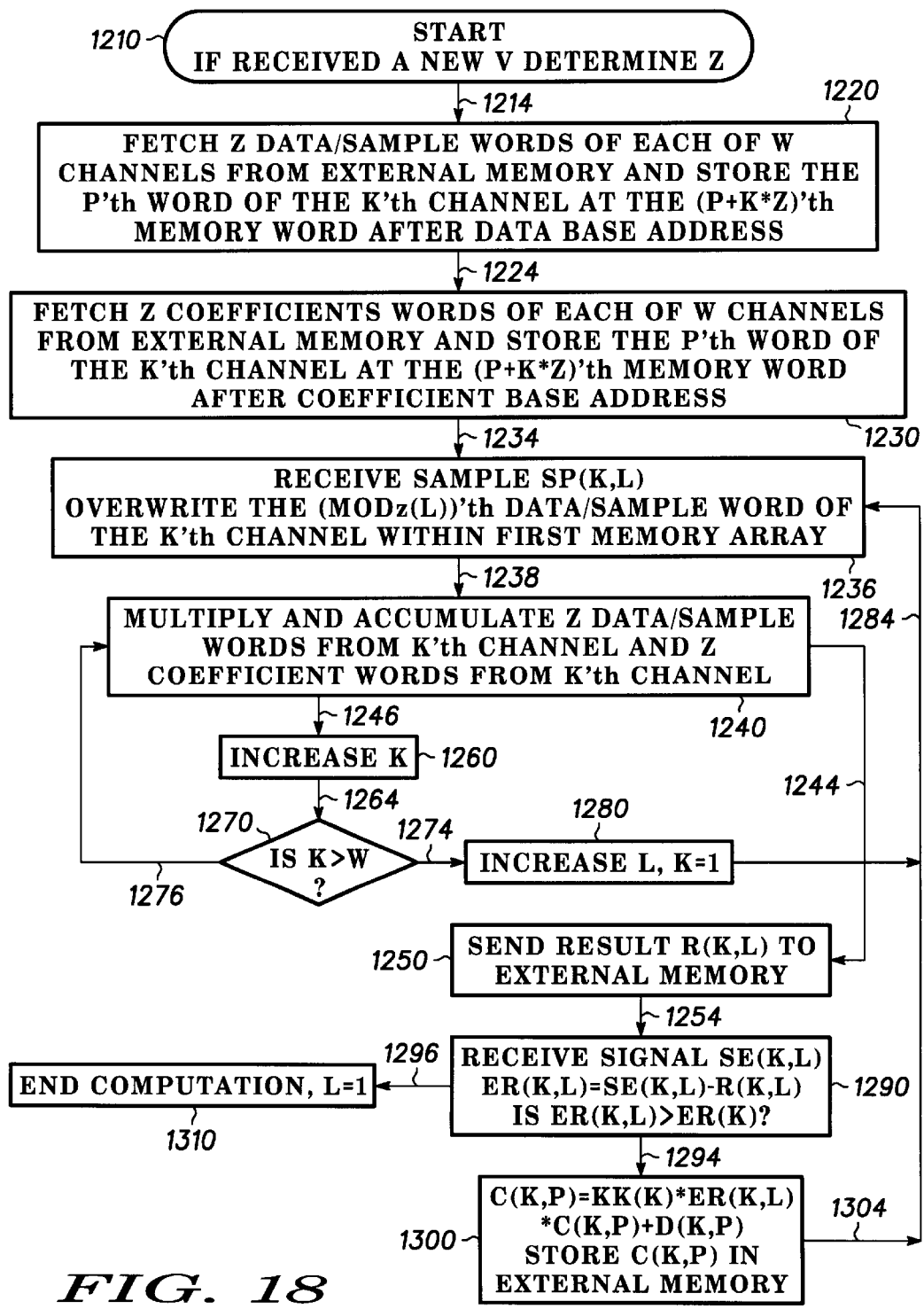
FIG. 18 is a flow chart of a method for canceling echoes, according to a preferred embodiment of the invention.

FIG. 17 is a schematic embodiment of a filter 90, coupled to near end user 1200, to far end user 1230, to hybrid connector 1210, to echo adder 1240, to processor 1220 and to external memory 110, according to a preferred embodiment of the invention. FIG. 18 is a flow chart of method 1200 for canceling echoes, according to a preferred embodiment of the invention.

Method 1200 comprises of the following steps:

Initialization step 1210. In step 1210 filter 90 checks what is V and accordingly changes Z. $Z=2^F$ and Z>=V>Z/2. As indicated by path 1214 and 1224, step 1210 is followed by step 1220, which is followed by step 1230.

In steps 1220 and 1230, and as explained in accordance with FIG. 12, K data/sample vectors and K coefficients vectors are sent to internal memory 130, so that the address of the P'th word of the K'th data/sample vector is DBASEA+(K*Z)+P. The address of the P'th tap of the K'th coefficient vector is CBASEA+(K*Z)+P. As indicated by path 1234, step 1230 is followed by step 1236.

In step 1236 filter 90 receives a L'th data sample associated with the K'th communication channel. This sample is referred to as SP(K,L). L is an index having positive values. SP(K,L) is written over the MODz(L)'th word of the K'th data/sample vector. As indicated by path 1238, step 1236 is followed by step 1240.

In step 1240, filter 90 executes an iteration—it performs Z MAC functions between the K'th data/sample vector and the K'th coefficient vector.

As indicated by paths 1244 and 1246, step 1240 is followed by steps 1250 and step 1260. Step 1250 is conveniently performed in parallel to steps 1260–1290. During step 1260 K is increased so that the (K+1)'th data/sample vector undergoes an iteration during the next execution of step 1240.

As indicated by path 1264, step 1260 is followed by query step 1270. In query step 1260, filter 90 checks if K>W. If the answer is "NO" step 1270 is followed by step 1240, as indicated by path 1276. If the answer is YES, step 1270 is followed by step 1280. During step 1280 L is increased and K is reset. As indicated by path 1284 step 1280 is followed by step 1236.

As indicated by path 1244, step 1240 is followed by step 1250. In step 1250 R(K,H) is sent to external memory 1250. As indicated by path 1254, step 1290 follows step 1250. In step 1250 processor 1220 receives a signal SE(K,L), resulting from the passage of sample SP(K,L) through hybrid connector 1210. Processor 1220 then compares signal SE(K, L) to sample SP(K,L). The difference between these two signals is an error signal denoted as E(K,L). Processor 1210 also checks if E(K,L)>E(K). E(K) is a predetermined value indicating the required error associated to the K'th communication channel. If the answer is "NO" step 1290 is followed by step 1300, as indicated by path 1294. If the answer is YES, then step 1290 is followed by step 1310 in which the echo canceling process ends and L is reset. As indicated by path 1304, step 1300 is followed by step 1236.

As indicated by path 1244, steps 1250 and 1300 are executed during the execution of steps 1260–1290, and even while executing step 1240 in accordance to another data/sample vector.

Thus, there has been described herein an embodiment including at least one preferred embodiment of an improved method and apparatus for grouping data processor instructions and embodiments of instruction systems. It will be apparent to those skilled in the art that the disclosed subject matter may be modified in numerous ways and may assume many embodiments other than the preferred form specifically set out and described above.

What is claimed is:

1. A filter, said filter being adapted to be coupled to an external memory, a control unit and W communication channels, the filter comprising:

an internal memory for storing data and coefficients;

an address generation unit, coupled to the internal memory, for generating memory addresses;

a multiply and accumulate MAC unit, coupled to the internal memory, for performing multiply and accumulate functions;

a first direct memory access DMA controller, coupled to the control unit, to the external memory and to the internal memory, for interfacing between the external memory and the internal memory;

a second DMA controller, coupled to the control unit, to the external memory and to the MAC unit, for interfacing between the external memory and the MAC unit;

wherein the internal memory comprises of a first memory bank and a second memory bank;

wherein the external memory is for storing data and coefficients;

wherein the control unit is coupled to the internal memory, to the external memory and to the MAC unit; and wherein the control unit is for controlling the filter in a plurality of modes of operation.

2. The filter of claim 1 wherein a mode of operation involves Finite Impulse Response FIR filtering of data associated with multiple communication channels;

wherein W external data vectors, associated with W communication channels accordingly, are stored in the external memory;

wherein each external data vector has Y data elements;

wherein W portions of the W external data vectors (data vectors), each having Z elements, are stored in consecutive order, in the internal memory;

wherein W coefficient vectors, associated with W communication channels accordingly, are stored in consecutive order in the internal memory;

wherein each coefficient vector has Z data elements;

wherein $Z=2^F$, $Y>Z$;

wherein $Z>=V>Z/2$; and wherein V is the number of taps of a filter associated with a single communication channel.

3. The filter of claim 2 wherein the FIR filtering involves a series of MAC functions between a coefficient vector and a data vector associated with the same communication channel;

wherein after a data vector is filtered, a new data element of an external data element replaces an element of the data vector;

wherein the filtering of a data vector is followed by filtering the consecutive data vector; and wherein the replacement of a data vector element by an element of an external data vector is executed while other data vectors are filtered;

wherein the filter is able to perform a mode switch and stop to operate in a certain mode; and wherein the mode switch involves storing the address of the next coefficient word to be sent to the MAC unit and storing the address of the next data word to be sent to the MAC unit.

4. The filter of claim 1 wherein a mode of operation involves Infinite Impulse Response (i.e.—IIR) filtering of data associated with multiple communication channels;

wherein W data vectors, associated with W communication channels accordingly, are stored in the internal memory;

wherein each data vector has Z data elements;

wherein a data/result vector initially comprises of Z data elements which are associated to a communication channel;

wherein the data elements are replaced by the results of a series of MAC functions between the data/result vector and the coefficient vector, associated to the same communication channel;

wherein W coefficient vectors, associated with W communication channels accordingly, are stored in consecutive order in the second memory bank;

wherein each coefficient vector has Y data elements;

wherein $Z=2^F$, $Y>Z$;

wherein $Z>=V>Z/2$;

wherein V is the number of taps of a filter associated with a single communication channel; and wherein W data/result vectors, associated with W communication channels accordingly, are stored in consecutive order in the first memory bank.

5. The filter of claim 4 wherein the filtering of a data/result vector is followed by filtering the consecutive data/result vector; and wherein an element of the data/result vector is replaced by the result of a series of MAC functions between the data/result vector and the coefficient vector, while other data/result vectors are filtered;

wherein the filter is able to perform a mode switch and stop to operate in a certain mode; and wherein the mode switch involves storing the address of the next coefficient word to be sent to the MAC unit and storing the address of the next data/result word to be sent to the MAC unit.

6. The filter of claim 1 wherein a mode of operation involves extrapolation of data associated with multiple communication channels;

wherein the external memory stores W external coefficient vectors, associated with W communication channels accordingly;

wherein each external coefficient vector has Z data elements;

wherein W portions of the W external coefficient vectors, each portion having Z" elements (i.e.—coefficient vector), are stored in consecutive order in the internal memory;

wherein the T'th element of a coefficient vector is the (S*M+T)'th elements of an external coefficient vector, T is an index having values of 1 to Z", S having values of 0 to M;

wherein to $Z=2^F$;

wherein $Z>=V>Z/2$;

wherein $Z"=Z/M$;

wherein M is the extrapolation factor; and wherein V is the number of taps of a filter associated with a single communication channel.

7. The filter of claim 6 wherein the extrapolation involves filtering data vectors by performing a series of MAC functions between a coefficient vector and a data vector associated with the same communication channel;

wherein after a data vector is filtered, a new data element of an external data element replaces an element of the data vector;

wherein the filtering of a data vector is followed by filtering the consecutive data vector;

wherein the replacement of a data vector element by an element of an external data vector is executed while other data vectors are filtered;

wherein after W data vectors associated with W communication channels are filtered S is increased; and wherein the filtering process continues until S=M.

8. The filter of claim 7 wherein the filter is able to perform a mode switch and stop to operate in a certain mode; and wherein the mode switch involves storing the address of the next coefficient word to be sent to the MAC unit and storing the address of the next data word to be sent to the MAC unit.

9. The filter of claim 1 wherein a mode of operation involves decimation of data associated with multiple communication channels;

wherein W external data vectors, associated with W communication channels accordingly, are stored in the external memory;

wherein each external data vector has Y data elements;

wherein W portions of the W external data vectors (i.e.—data vectors), each having Z elements, are stored in consecutive order, in the internal memory;

wherein W coefficient vectors, associated with W communication channels accordingly, are stored in consecutive order in the internal memory;

wherein each coefficient vector has Y data elements;

wherein $Z=2^F$, $Y>Z$;

wherein $Z>=V>Z/2$; and wherein V is the number of taps of a filter associated with a single communication channel.

10. The filter of claim 9 wherein the decimation involves filtering data vectors by performing a series of MAC functions between a coefficient vector and a data vector associated with the same communication channel; and wherein after a data vector is filtered, new M data elements of an external data element replace M elements of the data vector; and wherein M is the decimation factor;

wherein the filtering of a data vector is followed by filtering the consecutive data vector; and wherein the replacement of M data vector elements by M element of an external data vector is executed while other data vectors are filtered.

11. The filter of claim 10 wherein the filter is able to perform a mode switch and stop to operate in a certain mode; and wherein the mode switch involves storing the address of the next coefficient word to be sent to the MAC unit and storing the address of the next data word to be sent to the MAC unit.

12. The filter of claim 1 wherein the plurality of modes comprise of:

FIR filtering of data associated with multiple communication channels;

FIR filtering of data associated with a single communication channel;

IIR filtering of data associated with multiple communication channels;

IIR filtering of data associated with a single communication channel;

extrapolation of data associated with multiple communication channels;

extrapolation of data associated with a single multiple communication channel;

decimation of data associated with multiple communication channels;

decimation of data associated with a single multiple communication channel;

echo cancellation of echoes associated with multiple communication channels; and echo cancellation of echoes associated with a single communication channel.

13. The filter of claim 12 wherein the modes of FIR filtering of data associated with multiple communication channels and of FIR filtering of data associated with a single communication channel (i.e.—mode of FIR filtering), the modes of extrapolation of data associated with multiple communication channels and of extrapolation of data associated with a single multiple communication channel (i.e.—mode of extrapolation), the modes of decimation of data associated with multiple communication channels and of decimation of data associated with a single multiple communication channel (i.e.—mode of decimation) involve performing MAC functions between data vectors and coefficient vectors;

wherein the modes of IIR filtering of data associated with multiple communication channels and of IIR filtering of data associated with a single communication channel (i.e.—IIR filtering mode) involve performing MAC functions between data/result vectors and coefficient vectors;

wherein the modes of echo cancellation of echoes associated with multiple communication channels and of echo cancellation of echoes associated with a single communication channel (i.e.—echo cancellation mode) involve performing MAC functions between data/sample vectors and coefficient vectors;

wherein the data vectors associated to the FIR filtering mode, the data/result vectors associated to the IIR filtering mode, the data vectors associated to the decimation mode, the data vectors associated to the extrapolation mode, the data/sample vectors associated to the echo cancellation mode, the and wherein the coefficient vectors associated to the FIR filtering mode, the coefficient vectors associated to the IIR filtering mode, the coefficient vectors associated to the decimation mode, the coefficient vectors associated to the extrapolation mode and the coefficient vectors associated to the echo cancellation mode are stored in different locations of the internal memory bank, wherein the filter is able to perform a mode switch and stop to operate in a certain mode.

14. The filter of claim 13 wherein a data* vector is a data vector, when the filter operates in FIR filtering mode, extrapolation mode and decimation mode, is a data/result vector, when the filter operates in IIR filtering mode and is a data/sample vector when the filter operates in echo cancellation mode;

wherein all modes of operation sending a coefficient vector and a data* vector to the MAC unit and performing MAC operation between the coefficient vector and the data* vector; and wherein the mode switch involves storing the address of the next coefficient word to be sent to the MAC unit and storing the address of the next data* word to be sent to the MAC unit.

15. The filter of claim 14 wherein the storage the address of the next coefficient word to be sent to the MAC unit and storing the address of the next data* word to be sent to the MAC unit, allows the filter to resume working in the mode from which the filter performed a mode switch; wherein the filter resumes to work from the point in which it stopped working in the mode.

* * * * *

UNITED STATES PATENT AND TRADEMARK OFFICE
CERTIFICATE OF CORRECTION

PATENT NO. : 6,658,440 B1
DATED : December 2, 2003
INVENTOR(S) : Eran Pisek, Moshe Tarrab and David Moshe It is certified that error appears in the above-identified patent and that said Letters Patent is hereby corrected as shown below:

Column 16,
Line 40, change "wherein to Z= $2^F$;" to -- wherein Z = $2^F$; --

Signed and Sealed this

Seventeenth Day of August, 2004

JON W. DUDAS
*Acting Director of the United States Patent and Trademark Office*